US005541467A

United States Patent [19]

Kaida et al.

[11] Patent Number: 5,541,467

[45] Date of Patent: * Jul. 30, 1996

[54] VIBRATING UNIT

[75] Inventors: Hiroaki Kaida; Jiro Inoue, both of Nagaokakyo, Japan

[73] Assignee: Murata Manufacturing Co., Ltd., Japan

[ * ] Notice: The term of this patent shall not extend beyond the expiration date of Pat. No. 5,442,251.

[21] Appl. No.: 458,171

[22] Filed: May 26, 1995

Related U.S. Application Data

[63] Continuation of Ser. No. 86,015, Jul. 1, 1993, abandoned.

[30] Foreign Application Priority Data

| | | | |
|---|---|---|---|
| Jul. 3, 1992 | [JP] | Japan | 4-177068 |
| Jul. 16, 1992 | [JP] | Japan | 4-189726 |
| Jul. 21, 1992 | [JP] | Japan | 4-194288 |
| Jul. 21, 1992 | [JP] | Japan | 4-194289 |
| Jul. 27, 1992 | [JP] | Japan | 4-200038 |
| Aug. 11, 1992 | [JP] | Japan | 4-214152 |

[51] Int. Cl.$^6$ .......... H01L 41/08

[52] U.S. Cl. .......... 310/321; 310/348; 310/351; 310/367; 310/326

[58] Field of Search .......... 310/323, 326, 310/327, 328, 322, 321

[56] References Cited

U.S. PATENT DOCUMENTS

| | | | |
|---|---|---|---|
| 2,443,471 | 6/1948 | Mason | 310/326 X |
| 3,185,943 | 5/1965 | Honda et al. | 310/321 X |
| 3,411,023 | 11/1968 | Quate et al. | 310/323 |
| 3,488,530 | 1/1970 | Staudte | 310/321 |
| 4,350,918 | 9/1982 | Sato | 310/321 |
| 4,443,728 | 4/1984 | Kudo | 310/321 |
| 4,447,753 | 5/1984 | Ochiai | 310/321 |
| 4,484,382 | 11/1984 | Kawashima | 310/321 |
| 4,571,794 | 2/1986 | Nakamura | 310/321 |
| 4,900,971 | 2/1990 | Kawashima | 310/321 |
| 5,001,383 | 3/1991 | Kawashima | 310/367 |
| 5,006,824 | 4/1991 | Paff | 333/197 |
| 5,059,853 | 10/1991 | Kawashima | 310/367 |
| 5,107,164 | 4/1992 | Kimura | 310/367 |
| 5,159,301 | 10/1992 | Kaida et al. | 310/321 |
| 5,218,260 | 6/1993 | Kawashima | 310/367 X |
| 5,302,880 | 4/1994 | Kaida | 310/321 |
| 5,422,532 | 6/1995 | Inoue et al. | 310/321 |
| 5,442,251 | 8/1995 | Kaida et al. | 310/321 |

FOREIGN PATENT DOCUMENTS

| | | | |
|---|---|---|---|
| 0365268 | 4/1990 | European Pat. Off. | 310/367 |
| 2547458 | 2/1984 | France . | |
| 55-49013 | 4/1980 | Japan . | |
| 0064414 | 5/1980 | Japan | 310/344 |
| 0048818 | 3/1982 | Japan | 310/344 |
| 0260310 | 10/1988 | Japan | 310/367 |
| 0260311 | 10/1988 | Japan | 310/367 |
| 0311810 | 12/1988 | Japan | 310/367 |
| 0075213 | 3/1990 | Japan | 310/367 |
| 0079510 | 3/1990 | Japan | 310/367 |
| 0079511 | 3/1990 | Japan | 310/367 |
| 0079509 | 3/1990 | Japan | 310/367 |
| 2043995 | 10/1980 | United Kingdom . | |
| 2117968 | 10/1983 | United Kingdom . | |
| 2224159 | 4/1990 | United Kingdom | 310/367 |

OTHER PUBLICATIONS

Osamu Taniguchi, "Vibration Engineering", pp. 113–117, Corona Publishing Co., Ltd. with English language translation.

J. P. Den Hartog, "Mechanical Vibrations", pp. 87–93, Dover Publications, Inc. New York, 1985.

*Primary Examiner*—Mark O. Budd

*Attorney, Agent, or Firm*—Ostrolenk, Faber, Gerb & Soffen, LLP

[57] ABSTRACT

Disclosed herein is a vibrating unit containing a vibrator for utilizing vibration of the vibrator. A vibration transfer part is coupled to a portion of the vibrator exhibiting the minimum displacement or a portion close thereto, and a resonant part is coupled to the vibration transfer part and formed to receive vibration propagated from the vibrator to the vibration transfer part to resonate. The vibrating unit utilizes a dynamic vibration absorbing phenomenon.

16 Claims, 25 Drawing Sheets

(a)

(b)

(a)

(b)

(a)

(b)

VIBRATING UNIT

This is a continuation of application Ser. No. 08/086,015 filed on Jul. 1, 1993, now abandoned.

BACKGROUND OF THE INVENTION

1. Field of the Invention

The present invention relates to a vibrating unit utilizing vibration of a vibrator, and more particularly, it relates to a vibrating unit which can hold a vibrator without suppressing a vibrating state of the vibrator through a dynamic vibration absorbing phenomenon, and a piezo-resonator comprising such a structure.

2. Description of the Background Art

There have generally been proposed various units such as a piezo-resonator, an ultrasonic motor and a crystal oscillator utilizing vibrators, and employed in various fields.

Such a vibrating unit containing a vibrator must hold the vibrator therein without inhibiting the vibrator from vibration. To this end, an attempt has generally been made to hold the vibrator by a spring member such as a coil spring or an elastic material such as rubber.

When the vibrator is held by a spring member, however, the holding structure is complicated with increase in number of components. Even if the vibrator is held by such a spring member, further, the spring member cannot reliably absorb vibration which is transferred from the vibrator, and hence it may be impossible to allow vibration of the vibrator at a desired frequency.

When the vibrator is held through an elastic material such as rubber, on the other hand, vibration which is transferred from the vibrator can be absorbed to a certain extent. In this case, however, the elastic material may disadvantageously inhibit the vibration, and it may impossible to allow vibration of the vibrator at a desired frequency.

In the aforementioned structure of holding the vibrator through a spring member or an elastic material, further, it is difficult to selectively absorb only a vibration component of a specific frequency or mode in the vibration which is generated in the vibrator and transferred to the holding member. In order to positively utilize only a vibration component of a specific frequency or mode in vibration of a vibrator, it is preferable to maximally remove vibration components of other frequencies or modes. In the aforementioned holding structure, however, it is difficult to effectively remove such unnecessary vibration components.

On the other hand, there has been provided a unit, such as a tuning fork or a piezo-resonator, which has a portion for positively vibrating at a certain frequency. In such a unit, it is necessary to support the tuning fork or the resonator, serving as a vibration source, without suppressing its vibration. In other words, strongly required is a structure for mechanically holding the vibration source without inhibiting the same from vibration.

While a holding structure using a cushioning material such as a spring has been generally employed as such a structure, it is extremely difficult to reliably hold the vibration source such as a resonator or a tuning fork without inhibiting its vibration, while the holding structure is complicated.

In general, a piezo-resonator in a kHz band is prepared from (1) a resonator utilizing an expansion vibration mode of a rectangular piezoelectric plate, (2) a resonator utilizing a longitudinal vibration mode for stretching along the longitudinal direction of a bar type piezoelectric member, or (3) a piezoelectric tuning fork resonator.

A piezo-resonator vibrates when a voltage is applied to its resonant part. In order to form such a piezo-resonator as a practical component, therefore, it is necessary to support the piezo-resonator not to inhibit the resonant part from resonance. An energy trap type piezo-resonator can be mechanically supported in a region other than its resonant part, since vibrational energy is trapped in the resonant part. Considering application to a product, therefore, such an energy trap type piezo-resonator is easier to utilize. Thus, the energy-trap type piezo-resonator is desirable for a piezo-resonator in a kHz band.

In the aforementioned well-known resonator (1) utilizing an expansion vibration mode or the resonator (2) utilizing a longitudinal vibration mode, however, it is extremely difficult to trap vibrational energy. In a piezo-resonator 201 utilizing a longitudinal vibration mode shown in FIG. 1A, therefore, spring terminals 202 and 203 are adapted to hold a node of vibration, thereby holding the piezo-resonator 201. Also in a rectangular plate type piezo-resonator utilizing an expansion vibration mode, which is incapable of trapping vibrational energy, spring terminals are adapted to hold a node of the resonator. Thus, it is extremely difficult to form a piezo-resonator utilizing an expansion vibration mode or a longitudinal vibration mode in a kHz band as a surface-mountable miniature chip-type component, due to complicated structures of the elements.

In a piezoelectric tuning fork resonator 206 comprising a piezoelectric plate 204 which is polarized along the direction of thickness, slits 204*a* to 204*c* which are formed in the piezoelectric plate 204 and vibrating electrodes 205*a* (that provided on the rear surface is not shown) which are formed on both major surfaces around the central slit 204*b* as shown in FIG. 1B, on the other hand, energy is trapped in a vibrating portion. Therefore, this resonator 206 can be formed as a surface-mountable chip-type component since no fluctuation is caused in its characteristics even if the same is held in portions close to edges 204*d* and 204*e* of the piezoelectric plate 204.

However, the piezoelectric tuning fork resonator 206 can merely ensure a bandwidth in a range of only about 2% of the resonance frequency due to restriction in mode, although the same can trap energy. Thus, the piezoelectric tuning fork resonator 206 cannot satisfy strong requirement for a piezoelectric resonator ranging over a wide kHz band, which is awaited in the market.

SUMMARY OF THE INVENTION

Accordingly, a principal object of the present invention is to provide a vibrating unit which can hold a vibrator therein without inhibiting the vibrator from vibration, thereby enabling positive utilization of vibration at a desired frequency or in a desired mode.

Another object of the present invention is to provide an energy trap type piezo-resonator which can be effectively utilized in a kHz band for attaining characteristics in a wider band.

According to a wide aspect of the present invention, provided is a vibrating unit containing a vibrator for utilizing vibration of the vibrator. This vibrating unit comprises the vibrator, a vibration transfer part which is coupled to a portion of the vibrator having the minimum displacement or a portion close thereto, and a resonant part which is coupled to the vibration transfer part for receiving vibration of the vibrator to resonate.

The portion of the vibrator having the minimum displacement or the portion close thereto, which may be a node of the vibrator or a portion close thereto, includes a portion forming a node upon coupling with the vibration transfer part or a portion close thereto.

In the aforementioned vibrating unit, the vibration transfer part is coupled to the portion of the vibrator having the minimum displacement or the portion close thereto. Thus, the vibrator is hardly inhibited from vibration by the coupling with the vibration transfer part.

Since the vibration transfer part is coupled to the portion of the vibrator having the minimum displacement or the portion close thereto, vibration of the vibrator is not much transferred to the vibration transfer part. Further, the resonant part is coupled to the vibration transfer part for receiving vibration from the vibration source, which leaks through the vibration transfer part, to resonate.

Therefore, the vibration which is propagated through the vibration transfer part is effectively canceled by such resonance of the resonant part, as clearly understood from embodiments described later. When the portion of the resonant part having the minimum displacement is selected and coupled to another portion, therefore, vibration in the inventive vibrating unit is hardly constrained by the said other portion.

In other words, the vibration is trapped in a portion between the vibrator and the resonant part, whereby the vibration of the vibrator is hardly influenced even if the resonant part is mechanically held by another member. Thus, it is possible to allow vibration of the vibrator at a desired frequency in a desired vibration mode, with no requirement for a spring member or an elastic material.

The action of the resonant part canceling the vibration which is transferred from the vibration transfer part is conceivably caused by a well-known dynamic vibration absorbing phenomenon. Such a dynamic vibration absorbing phenomenon is described in "Vibration Technology" by Osamu Taniguchi, Corona Publishing Co. Ltd., Japan, pp. 113 to 116 in detail, for example. Briefly stated, the dynamic vibration absorbing phenomenon is such a phenomenon that a main vibrator, which must be prevented from vibration, is inhibited from vibration by a subvibrator when the subvibrator is coupled to the main vibrator with a properly selected natural frequency. The resonant part of the vibrating unit according to the present invention corresponds to the subvibrator in the dynamic vibration absorbing phenomenon, whereby the vibration which is transferred from the vibrator through the vibration transfer part is suppressed by the resonant part on the basis of the dynamic vibration absorbing phenomenon. Accordingly, as used herein, the term "resonant part" refers to a dynamic damper that vibrates at a selected natural frequency.

According to the present invention, it is possible to allow vibration of a vibrator in design in a vibrating unit such as a piezo-resonator, an ultrasonic motor or a unit containing a crystal oscillator. Thus, it is possible to provide a vibrating unit which can exhibit desired frequency and operation characteristics.

According to a specific aspect of the present invention, provided is a piezo-resonator comprising a piezo-resonance unit, a vibration transfer part having an end which is coupled to the piezo-resonance unit, and a resonant part which is coupled to the vibration transfer part for receiving vibration of the piezo-resonance unit to resonate. This piezo-resonator corresponds to a component which is obtained by applying the vibrating unit provided according to the wide aspect of the present invention to a piezo-resonator.

According to the inventive piezo-resonator, the resonant part is so formed as to resonate by vibration which is propagated through the vibration transfer part. Similarly to the aforementioned vibrating unit according to the present invention, therefore, the propagated vibration is canceled by a dynamic vibration absorbing phenomenon, so that this vibration is hardly transferred to a portion beyond the resonant part. In other words, it is possible to provide an energy trap type piezo-resonator which traps vibrational energy in a portion up to the resonant part.

When the piezo-resonance unit is formed in a proper structure such as that of a piezo-resonance unit utilizing a longitudinal vibration mode or that of a piezo-resonance unit utilizing an expansion vibration mode of a rectangular plate, therefore, it is possible to implement an energy trap type piezo-resonator ranging over a wide band, which can be applied to a kHz band or a several MHz band.

According to a more specific aspect of the inventive piezo-resonator, provided is a piezo-resonator having a piezo-resonance unit utilizing a longitudinal wave and a resonant part which is coupled to a vibration transfer part in a portion other than a node, being not coupled with the resonant part, of vibration of the vibration transfer part which is allowed by vibration propagated from the piezo-resonance unit. According to this structure, the resonant part is coupled to the portion of the vibration transfer part other than its node, whereby relatively large vibration which is transferred from the vibration transfer part to the resonant part is effectively canceled by a dynamic vibration absorbing phenomenon.

According to a further preferable aspect of the present invention, the resonant part is so formed as to resonate at a resonance frequency which is substantially identical to that of the vibration propagated from the vibrator to the resonant part, whereby the as-propagated vibration can be effectively canceled on the basis of the aforementioned dynamic vibration absorbing phenomenon.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

As used herein, resonant part refers to a dynamic damper that vibrates at a selected natural frequency, as discussed as page 7, lines 5 to 21, supra.

Embodiments of the present invention are now described with reference to the drawings, for clarifying the present invention.

Figure 2:
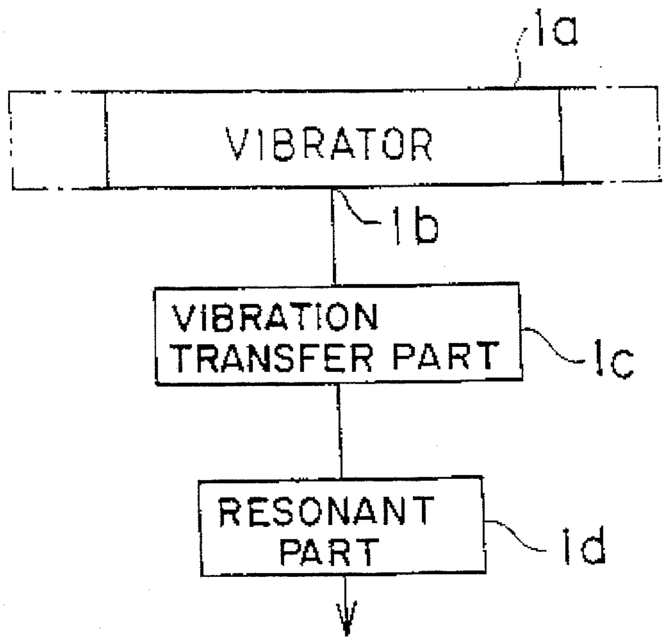
FIG. 2 is a schematic block diagram for illustrating the principle of the present invention.

FIG. 2 is a schematic block diagram for illustrating the principle of the present invention.

It is assumed here that a vibrator 1*a* vibrates between a state shown by solid lines and that shown by one-dot chain lines in FIG. 2. In this case, a central portion 1*b* of the vibrator 1*a* along its longitudinal direction exhibits the minimum displacement in the vibrating state of the vibrator 1*a*. A vibration transfer part 1*c* is coupled to this central portion 1*b*.

Since the vibration transfer part 1*c* is thus coupled to the central portion 1*b* which exhibits the minimum displacement, vibration of the vibrator 1*a* is not much suppressed by such coupling with the vibration transfer part 1*c*. On the other hand, the vibration transfer part 1*c* is coupled with a resonant part 1*d*, which is adapted to receive vibration transferred through the vibration transfer part 1*c* and resonate. Namely, vibration of the vibrator 1*a* is hardly transferred to the vibration transfer part 1*c* which is coupled to the central portion 1*b* of the vibrator 1*a* exhibiting the minimum displacement, while the resonant part 1*d* receives a slightly leaking part of the vibration to resonate.

Figure 1A:
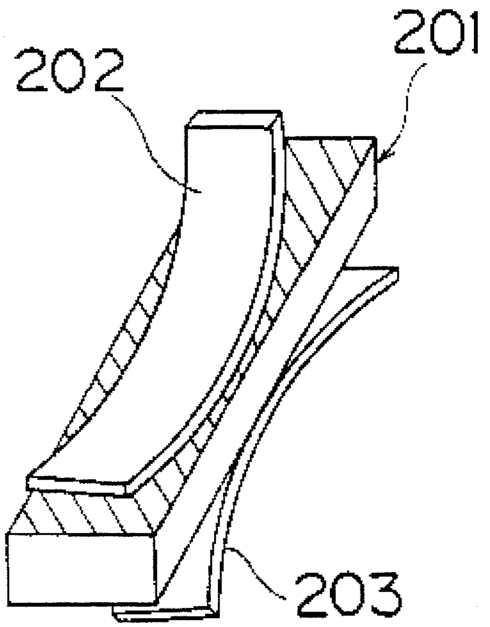
Fig.1A PRIOR ART
FIGS. 1A and 1B are a perspective view and a plan view for illustrating a conventional piezo-resonator utilizing a longitudinal vibration mode and a conventional piezoelectric tuning fork resonator respectively.
Figure 1B:
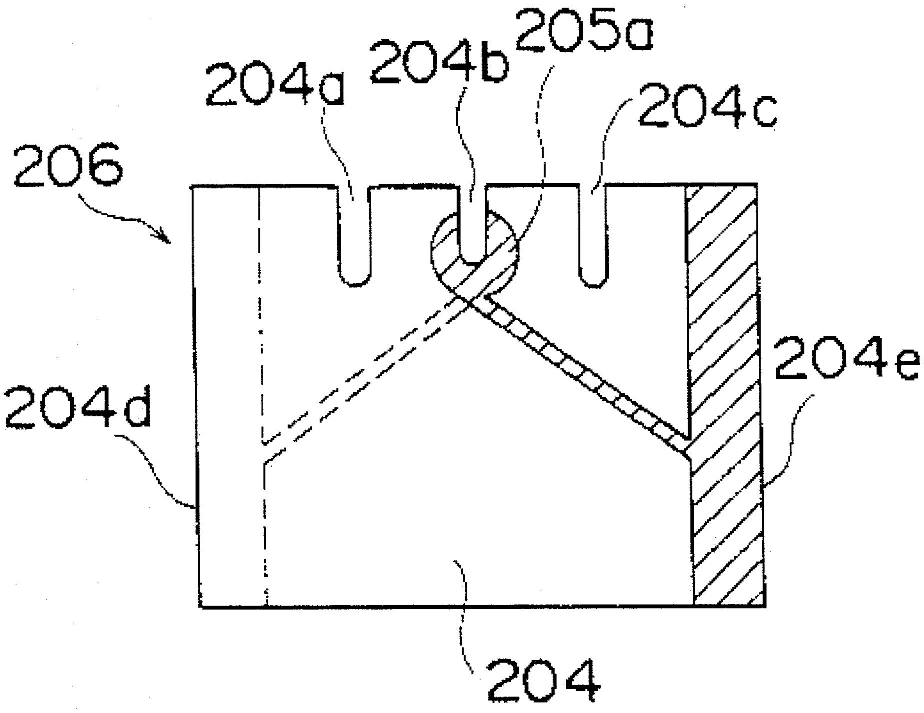
Fig.1B PRIOR ART

On the other hand, vibrational energy which is propagated through the vibration transfer part 1*c* is canceled by such resonance of the resonant part 1*d*. Thus, it is possible to mechanically hold the vibrating unit shown in FIG. 1 without inhibiting the vibrator 1*a* from vibration, by coupling a portion of the resonant part 1*d* exhibiting the minimum displacement with the exterior.

The aforementioned phenomenon of canceling the leaking part of the vibration by the resonance of the resonant part is now described with reference to FIGS. 3 to 5.

Figure 3:
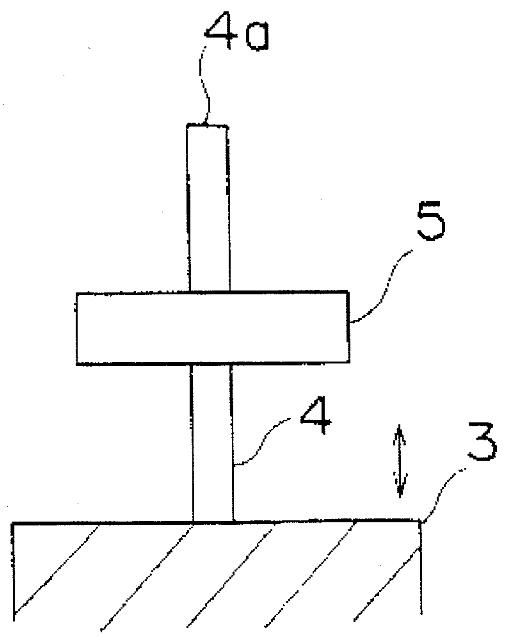
FIG. 3 is a front sectional view showing a testing device for illustrating the principle of the present invention.

FIG. 3 is a front sectional view showing a testing device for clarifying the principle of the present invention. Referring to FIG. 3, a support rod 4 is uprightly provided on an upper surface of a vibration testing device 3. A steel bar 5 which can vibrate in a bending mode is fixed to a vertical intermediate position of the support rod 4. The steel bar 5 is a bar-type member, which is made of steel, of 180 mm in length, 12 mm in width and 15 mm in thickness, having weight of 240 g and a resonance frequency of about 1 kHz in bending. On the other hand, the support rod 4, which is a columnar member of steel having a diameter of 8 mm, is inserted in a through hole provided in a center of the steel bar 5. The steel bar 5 and the support rod 4 are fixed to each other in the state shown in FIG. 3. Thus, the vibration testing device 3 corresponds to a piezo-resonance unit according to the present invention and the steel bar 5 corresponds to a resonant part, while a portion of the support rod 4 downward beyond the steel bar 5 corresponds to a vibration transfer part.

Figure 4:
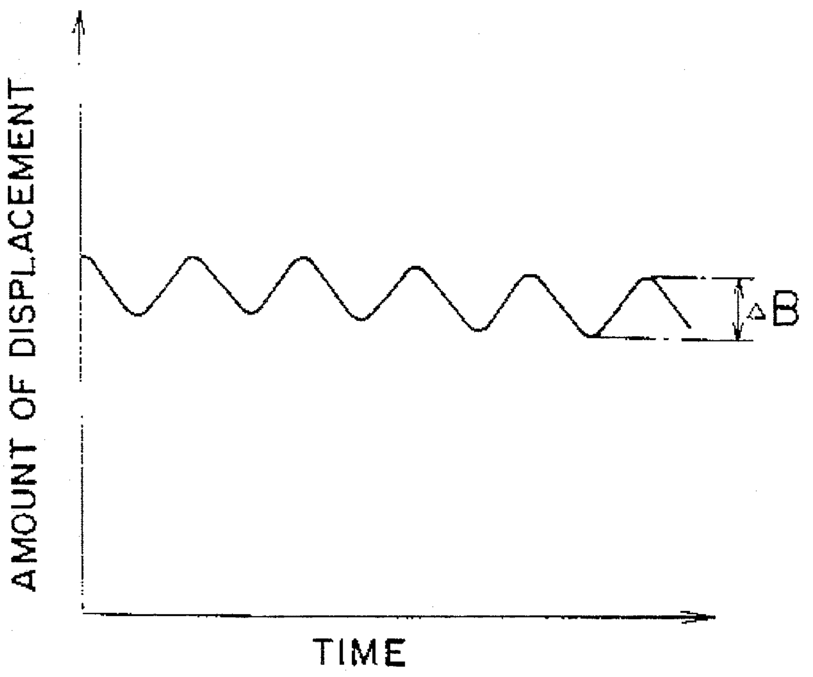
FIG. 4 illustrates relation between displacement and time in the testing device shown in FIG. 3.

When the vibration testing device 3 was allowed to vertically vibrate at a frequency of 1 kHz as shown by arrow in FIG. 3, the steel bar 5 resonated in a bending mode, whereby an upper end 4*a* of the support rod 4 was displaced as shown in FIG. 4. Referring to FIG. 4, the amount ΔB of displacement was about 2.6 μm. For the purpose of comparison, a support rod 4 was uprightly provided on a similar vibration testing device 3 with no steel bar 5, and the vibration testing device 3 was allowed to vibrate in a similar manner to the above. In this case, an upper end 4*a* of the support rod 4 was transversely displaced by such bending mode vibration as shown in FIG. 5, with an amount ΔB of displacement of about 22.6 μm.

Figure 5:
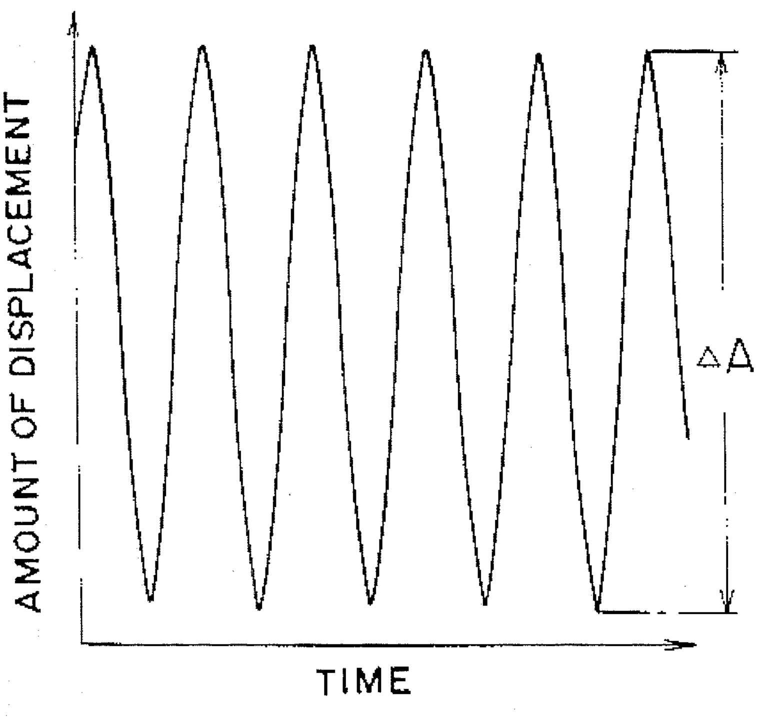
FIG. 5 illustrates relation between displacement and time in a testing device provided with no resonator.

Comparing FIGS. 4 and 5 with each other, it is understood that the vibration which was transferred from the vibration testing device 3 through the support rod 4 was sufficiently damped by the steel bar 5.

On the assumption that the vibration was damped by the mass of the steel bar 5, the inventors made another experiment by changing the frequency of the vibration with no resonance of the steel bar 5. As the result, it was confirmed that the amount of displacement on the upper end 4*a* of the support rod 4 was not suppressed as shown in FIG. 4. Thus, it is conceivable that the as-propagated vibration was not merely damped by the weight of the steel bar 5, but this vibration was canceled by the aforementioned dynamic vibration absorbing phenomenon.

Figure 6:
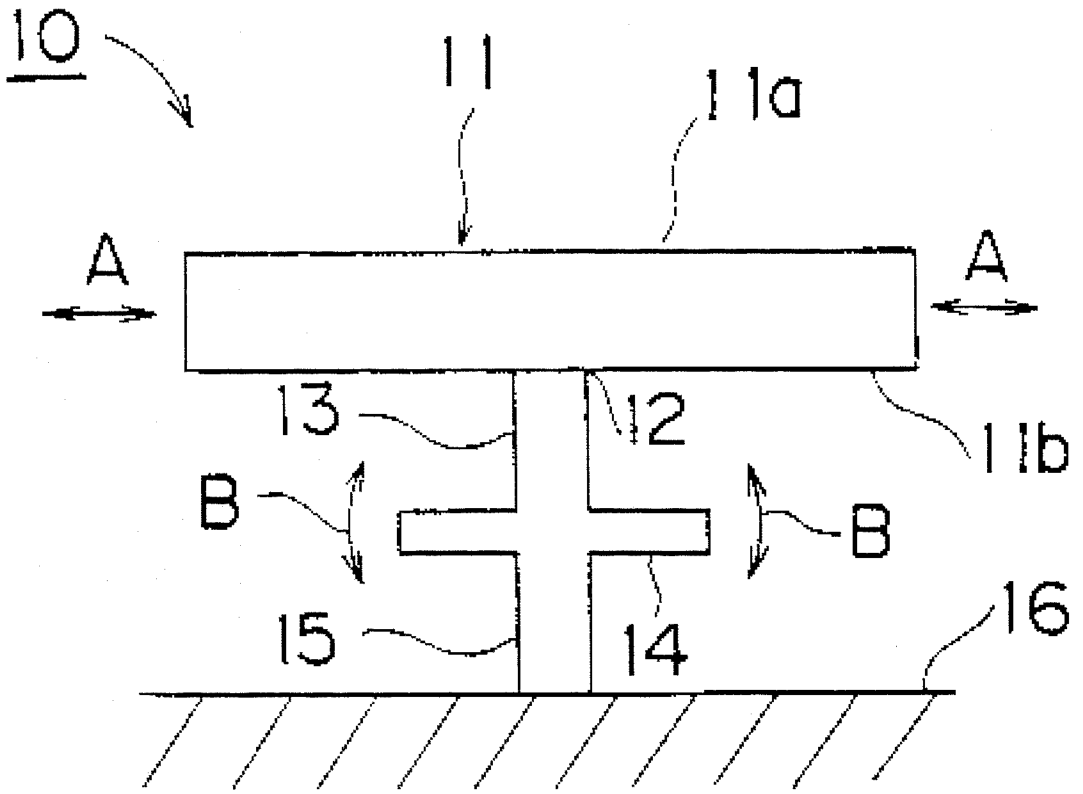
FIG. 6 is a front sectional view showing a vibrating unit according to a first embodiment of the present invention.

FIG. 6 is a front sectional view showing a vibrating unit 10 according to a first embodiment of the present invention. In the vibrating unit 10 according to this embodiment, a vibrator 11 stretchingly vibrates along arrows A in FIG. 6. Therefore, central portions of upper and lower surfaces 11*a* and 11*b* exhibit the minimum displacement in the vibrator 11. According to this embodiment, a support bar 13 for serving as a vibration transfer part is coupled to the central portion 12 of the lower surface 11*b*. A resonant part 14 is coupled to a lower end of the support bar 13.

The resonant part 14 is so formed as to horizontally extend along the lower end of the support bar 13, to be capable of resonating in a bending mode. In such a resonant part 14, a resonance frequency in the aforementioned bending mode is preferably in agreement with an oscillation frequency of the vibrator 11, so that the as-leaking part of the vibration can be further effectively canceled in the resonant part 14 on the basis of a dynamic vibration absorbing phenomenon.

In the resonant part 14 vibrating in a bending mode as shown by arrows B in FIG. 6, its central portion along the horizontal direction exhibits the minimum displacement. Therefore, a coupling bar 15 is coupled to a lower central portion of the resonant part 14. Thus, vibration propagated through the support bar 13 serving as a vibration transfer part is so sufficiently damped in the resonant part 14 that the vibration is hardly transferred to the coupling bar 15. Therefore, the vibrator 11 is not inhibited from vibration even if the coupling bar 15 is fixed to a chassis 16 of the unit.

While the support bar 13 serving as a vibration transfer part preferably inhibits no vibration of the vibrator 11, this support bar 13 may be formed by a rigid material for serving as a vibration transfer part, since the as-propagated vibrational energy is canceled by action of the resonant part 14.

As hereinabove described, the propagated vibration energy is canceled by the resonant part 14 conceivably because of a dynamic vibration absorbing phenomenon, since the resonant part 14 acts as the subvibrator in the aforementioned well-known dynamic vibration absorbing phenomenon. Thus, the resonant part 14 is so formed as to enable positive utilization of a dynamic vibration absorbing phenomenon in the vibrating unit according to the present invention, whereby vibration of the vibrator 11 can be trapped in a portion up to the resonant part 14 without inhibiting the vibrator 11 from vibration.

Figure 7:
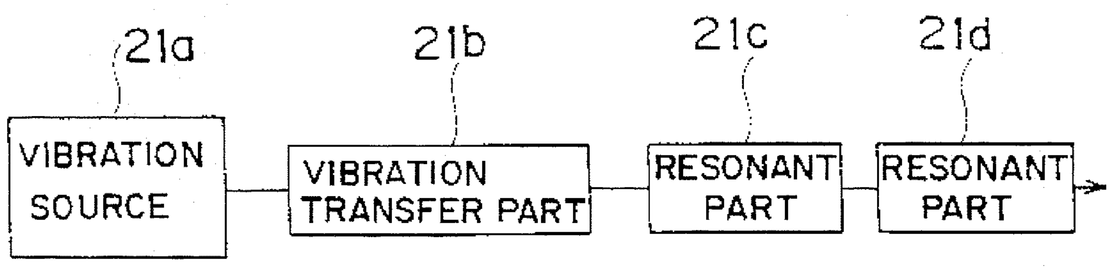
FIGS. 7(*a*) and 7(*b*) are schematic block diagrams showing modifications of the first embodiment of the present invention respectively.
Figure 7:
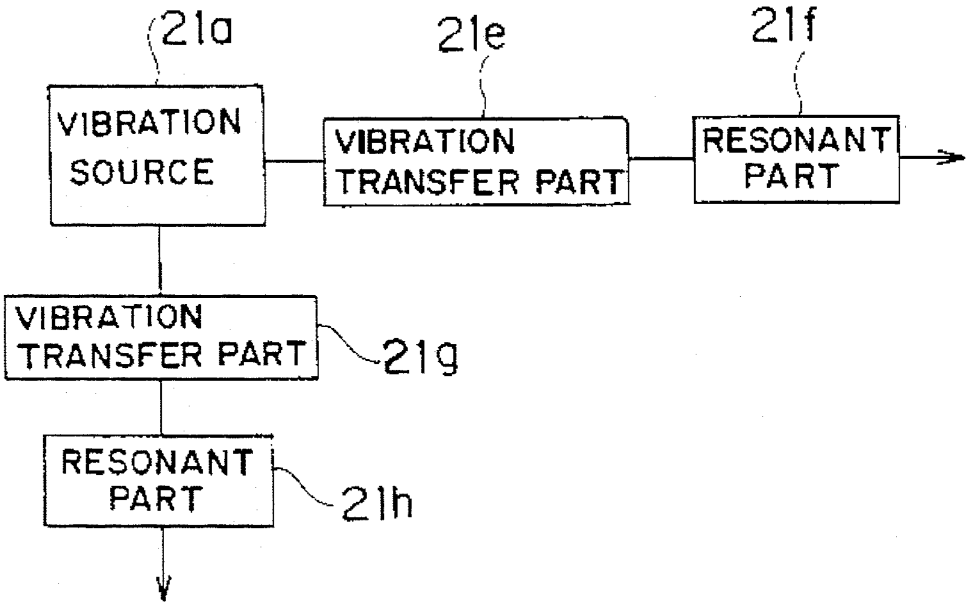

FIGS. 7(*a*) and 7(*b*) are schematic block diagrams typically illustrating principles of energy trap type vibrating units according to modifications of the first embodiment of the present invention.

Referring to FIG. 7(*a*), a vibration source 21*a* is formed by a proper member, such as a motor, a compressor, a piezo-resonator or a tuning fork, for example, generating vibration. A vibration transfer part 21*b* is coupled to this vibration source 21*a*. The vibration transfer part 21*b*, which may simply be formed to be capable of receiving vibration generated in the generation source 21*a*, is appropriately provided in the form of a bar or a plate. In order to attain a higher damping effect, the vibration transfer part 21*b* is preferably made of a material, such as rubber, having a damping property itself. Alternatively, the vibration transfer part 21*b* may be made of a rigid material such as a metal.

A first resonant part 21*c* is coupled to the other end of the vibration transfer part 21*b*. The first resonant part 21*c* is so formed as to receive vibration which is propagated from the vibration source 21*a* through the vibration transfer part 21*b*, and to resonate. Further, a second resonant part 21*d* is coupled to the other end of the first resonant part 21*c*. The second resonant part 21*d* is so formed as to receive vibration which is propagated through the vibration transfer part 21*b* and the first resonant part 21*c*, and to resonate.

The first and second resonant parts 21*c* and 21*d* are formed to be capable of resonating in proper vibration modes such as a bending mode, a longitudinal vibration mode and the like, while resonance frequencies thereof and/or the vibration modes differ from each other. The resonance frequencies and/or the vibration modes of the first and second resonant parts 21*c* and 21*d* are so selected as to damp various vibration components. Namely, the resonant parts 21*c* and 21*d* act to cancel specific vibration components by a dynamic vibration absorbing phenomenon, in response to the resonance frequencies and/or the vibration modes thereof. In general, the vibration source 21*a* generates coupling vibration which includes vibration components of various modes and frequencies. Thus, it is possible to further effectively damp such coupling vibration propagated from the vibration source 21*a*, by providing a plurality of resonant parts 21*c* and 21*d* resonating at different resonance frequencies and/or in different vibration modes.

The vibration source 21*a* may vibrate in extremely high vibration strength at a specific frequency and in a specific vibration mode. In this case, it is possible to effectively damp the specific vibration having high vibration strength by forming the resonant parts 21*c* and 21*d* so that the resonance frequencies thereof are in agreement with the specific frequency of this vibration.

While the first and second resonant parts 21*c* and 21*d* are coupled to the vibration source 21*a* through the single vibration transfer part 21*b*, such a plurality of resonant parts may be coupled to different vibration transfer parts. Namely, first and second resonant parts 21*f* and 21*h* may be coupled to a vibration source 21*a* through different vibration transfer parts 21*e* and 21*g* respectively, as shown in FIG. 7(*b*).

Figure 8:
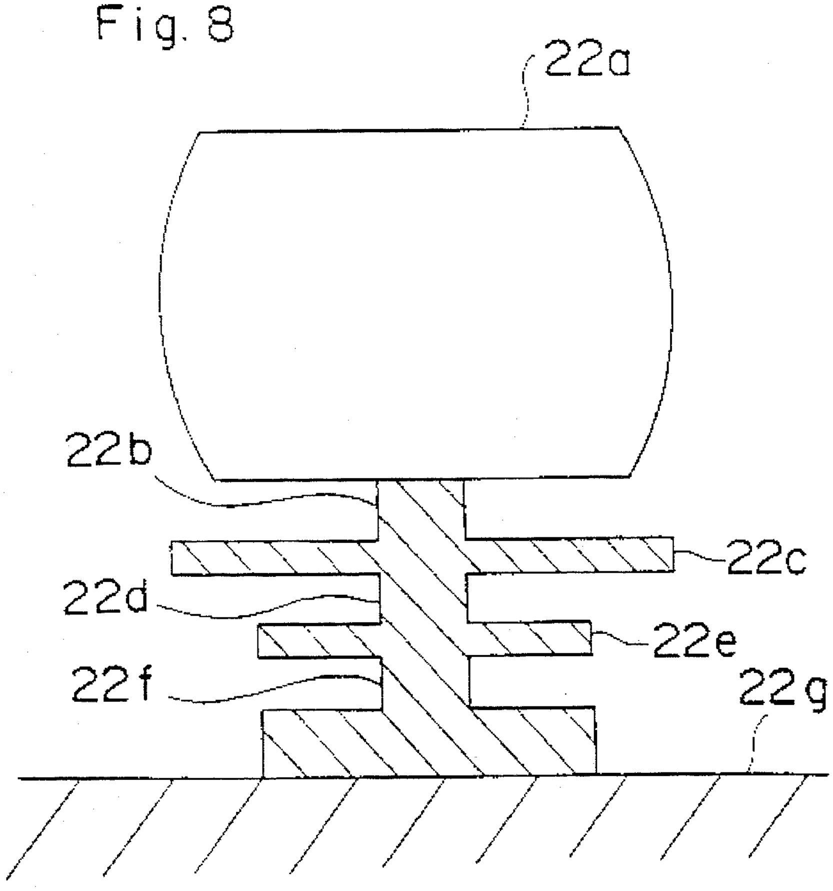
FIG. 8 is a front sectional view showing a vibrating unit embodying the modification shown in FIG. 7(*a*)

FIG. 8 is a front sectional view for illustrating an energy trap type vibrating unit embodying the modification shown in FIG. 7(*a*).

In this structure, a motor 22*a* is employed as a vibration source, and a support member 22*b* is coupled to a lower surface of this motor 22*a* to serve as a vibration transfer part. A resonant plate 22*c* defining a first resonant part is integrally formed on a lower end of the support member 22*b*. The resonant plate 22*c*, which extends perpendicularly to the plane of FIG. 8, is so formed as to receive vibration propagated through the support member 22*b*, and to resonate in a bending mode.

Further, a second support member 22*d* is coupled to a lower surface of the resonant plate 22*c* to serve as another vibration transfer part, while s second resonant plate 22*e* is coupled to a lower and of the second support member 22*d*. The second resonant plate 22*e*, which extends perpendicularly to the plane of FIG. 8, is formed to be different in size from the first resonant plate 22*c*. Thus, the second resonant plate 22*e* resonates at a frequency which is different from that of the first resonant plate 22*c*.

A third support member 22*f* is coupled to a lower surface of the second resonant plate 22*e*. A lower surface of the third support member 22*f* is fixed to a floor face 22*g*.

In the energy trap type vibrating unit having the aforementioned structure, vibration of the motor 22*a* is transferred to the first support member 22*b*, and the first resonant plate 22*c* resonates by vibration propagated through the first support member 22*b*. Further, the second resonant plate 22*e* resonates by vibration propagated through the first resonant plate 22*c* and the second support member 22*d*. The first and second resonant plates 22*c* and 22*e*, which are formed to be different in resonance frequency from each other, effectively cancel components of the vibration, being propagated from the motor 22*a* to the support member 22*b*, which are in agreement with the resonance frequencies of the first and second resonant plates 22*c* and 22*e* respectively by a dynamic vibration absorbing phenomenon.

When the vibration generated in the motor 22*a* serving as a vibration source includes vibration components having high strength values at two specific frequencies, therefore, it is possible to effectively prevent the motor 22*a* from leakage of the vibration to the floor surface 22*g* by forming the first and second resonant plates 22*c* and 22*e* with resonance frequencies which are in agreement with such specific frequencies.

Embodiment of Piezo-Resonator

Figure 9:
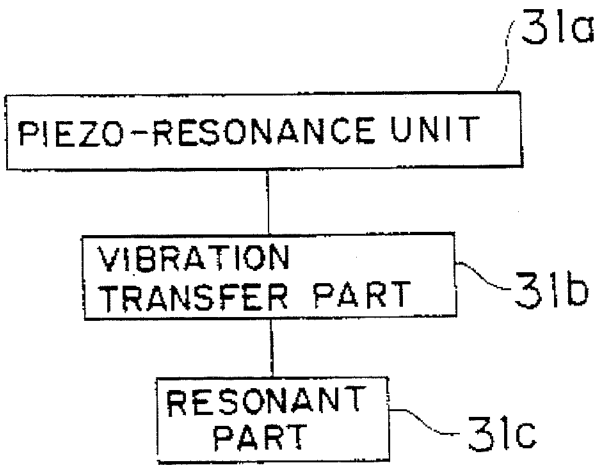
FIG. 9 is a schematic block diagram for illustrating the structure of a second embodiment according to the present invention.

FIG. 9 is a schematic block diagram for illustrating a piezo-resonator according to a second embodiment of the present invention. In this piezo-resonator, a vibration transfer part 51*b* is coupled to a piezo-resonance unit 31*a*, while a resonant part 31*c* is coupled to the vibration transfer part 31*b*.

The piezo-resonance unit 31*a* is formed to be capable of being excited in a proper vibration mode such as a longitudinal vibration mode, a contour shear vibration mode, an expansion vibration mode or the like. On the other hand, the vibration transfer part 31*b* is adapted to transfer vibration which is propagated from the piezo-resonance unit 31*a* to the resonant part 31*c*. Therefore, the structure of the vibration transfer part 51*b* itself is not particularly restricted so far as the same can support the piezo-resonance unit 31*a* and transfer its vibration to the resonant part 31.

The resonant part 51*c* is so formed as to receive vibration which is propagated through the vibration transfer part 31*b*, and to resonate. This resonant part 51*c*, which is formed to resonate in a proper vibration mode such as a bending mode, acts to cancel the as-propagated vibration by the aforementioned dynamic vibration absorbing phenomenon, as hereinafter described with reference to experimental example and Example.

Embodiment of Piezo-Resonator Utilizing Longitudinal Vibration Mode

Figure 10:
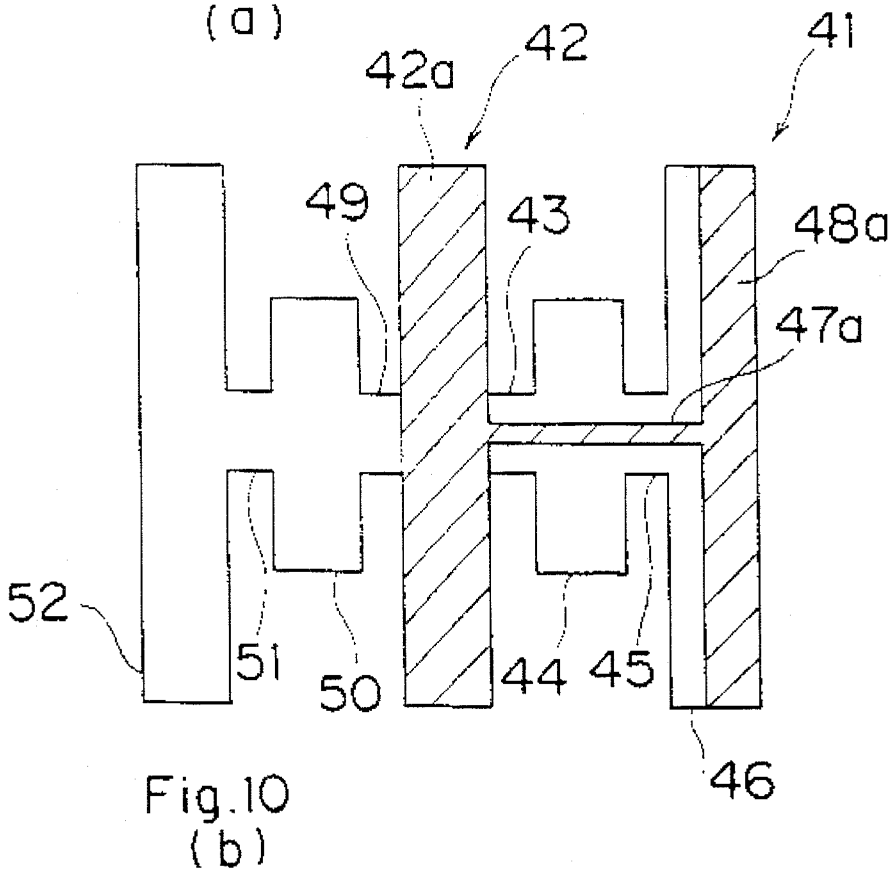
FIGS. 10(*a*) and 10(*b*) are a plan view of a piezo-resonator according to the second embodiment of the present invention and a typical plan view showing a shape of an electrode, provided on a lower surface, through a piezoelectric substrate respectively.
Figure 10:
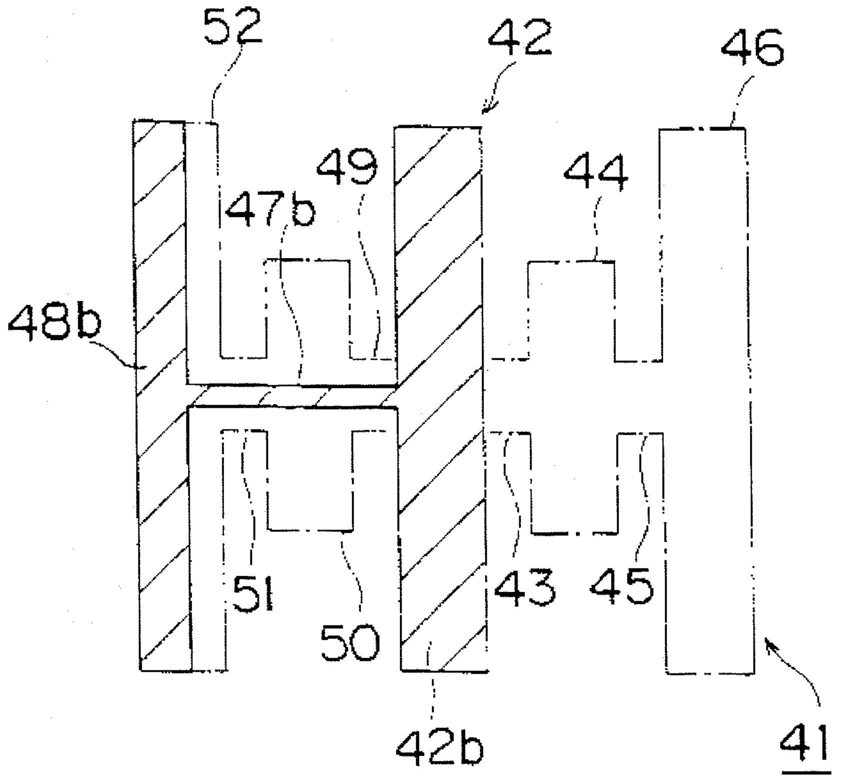

FIGS. 10(*a*) and 10(*b*) are plan views showing a piezo-resonator 41 according to a second embodiment of the present invention and a shape of an electrode provided on a lower surface through a piezoelectric substrate respectively. The piezo-resonator 41 has a piezo-resonance unit 42 which is arranged on a central portion. This piezo-resonance unit 42 is formed by a piezoelectric substrate, which is uniformly polarized in the direction of its thickness, having an elongated rectangular planar shape, and electrodes 42*a* and 42*b* formed on both major surfaces of the piezoelectric substrate. An alternating voltage is so applied through the electrodes 42*a* and 42*b* that the piezo-resonance unit 42 stretchingly vibrates in a longitudinal vibration mode.

A vibration transfer part 43 is coupled to one side of a longitudinal central portion of the piezo-resonance unit 42. This vibration transfer part 43 is adapted to transfer vibration following the stretching vibration of the piezo-resonance unit 42 to a resonant part 44 as described later. The vibration transfer part 43 is coupled to the longitudinal central portion of the piezo-resonance unit 42, not to inhibit the piezo-resonance unit 42 from vibration.

The other end of the vibration transfer part 43 is coupled with the resonant part 44, which is so formed as to receive vibration of the piezo-resonance unit 42 and to resonate at a frequency which is substantially identical to the resonance frequency of the piezo-resonance unit 42 in a bending mode. The other end of the vibration transfer part 43, being coupled with the resonant part 44, is a portion other than a node of the vibration transfer part 43. Further, a holding part 46 having a relatively large area is coupled to the resonant part 44 through a coupling bar 45. This holding part 46 is provided in the relatively large area as shown in the figures, to be suitable for mechanically holding the piezo-resonator 41 on another member such as a case substrate.

The electrode 42*a* is electrically connected to a terminal electrode 48*a*, which is formed on an upper surface of the holding part 46, by a connecting conductive part 47*a*.

A vibration transfer part 49, a resonant part 50, a coupling bar 51 and a holding part 52 are also coupled to the piezo-resonance unit 42 on a side opposite to that coupled with the vibration transfer part 43. As shown in FIG. 10(*b*), a connecting conductive part 47*b* and a terminal electrodes 48*b* which are electrically connected to the electrode 42*b* are formed on lower sides of the vibration transfer part 49, the resonant part 50, the coupling bar 51 and the holding part 52 respectively.

In the piezo-resonator 41 of this embodiment, an alternating voltage is applied across the terminal electrodes 48*a* and 48*b*, so that the piezo-resonance unit 42 stretchingly vibrates in a longitudinal vibration mode. Consequently, this vibration is transferred to the resonant parts 44 and 50 through the vibration transfer parts 43 and 49. The resonant parts 44 and 50 serve as subvibrators in the aforementioned dynamic vibration absorbing phenomenon, whereby the vibration hardly leaks toward the coupling bars 45 and 51. Therefore, vibrational energy is trapped in portions up to the resonant parts 44 and 50, whereby it is possible to implement the piezo-resonator 41 of an energy trap type utilizing a longitudinal vibration mode by mechanically coupling the same to the exterior through the holding parts 46 and 52.

Action of the resonant part 44 is now described on the basis of a result of a concrete experiment.

Figure 11:
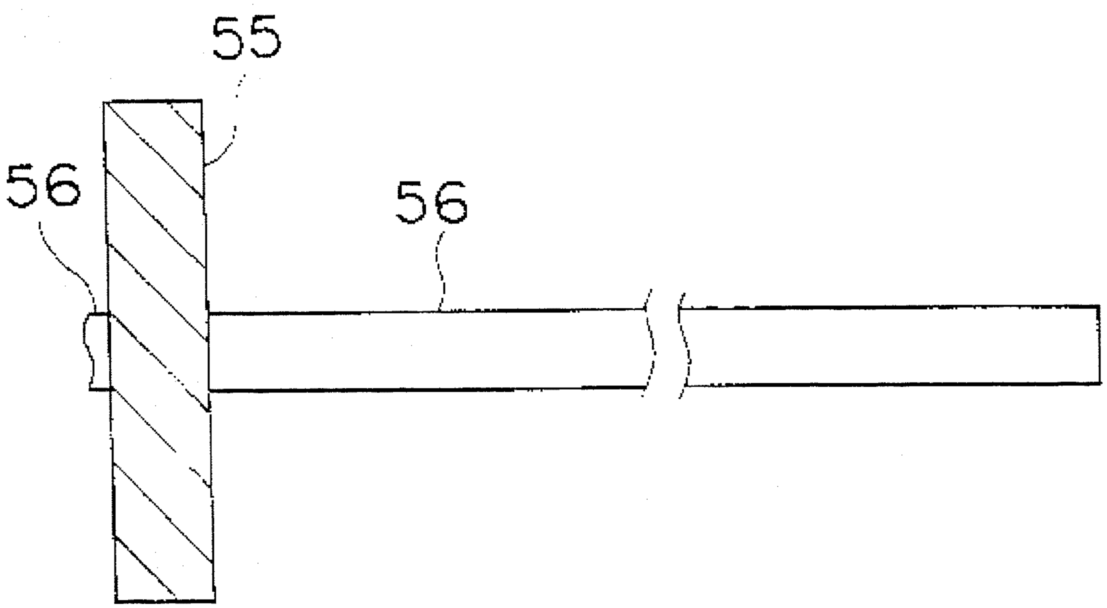
FIG. 11 is a partially fragmented plan view showing a structure of a piezo-resonance unit utilizing a longitudinal vibration mode, which is coupled with a bar.

FIG. 11 illustrates a structure, prepared for the purpose of comparison, comprising a piezo-resonance unit 55 which is formed to be capable of vibrating in a longitudinal vibration mode and a bar 56 which is coupled to a central portion of one side surface of the piezo-resonance unit 55 to extend in a direction perpendicular to the piezo-resonance unit 55. Another bar 56 is also coupled to a central portion of another side surface of the piezo-resonance unit 55.

Figure 12:
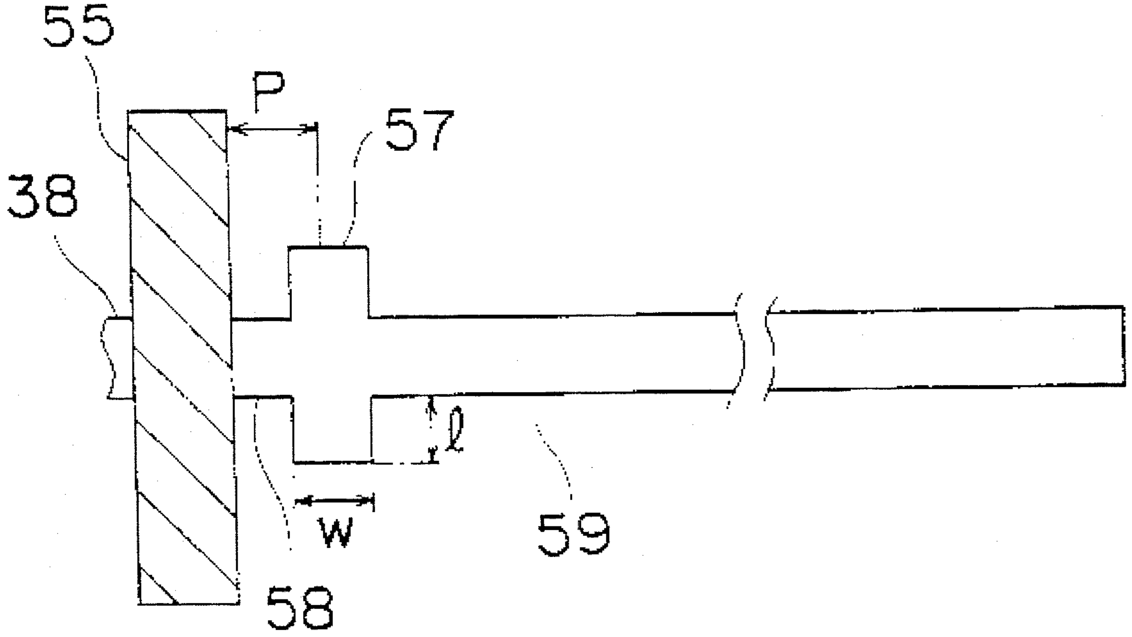
FIG. 12 is a partially fragmented plan view showing a structure of another piezo-resonance unit utilizing a longitudinal vibration mode, which is coupled with a resonant part.
Figure 13:
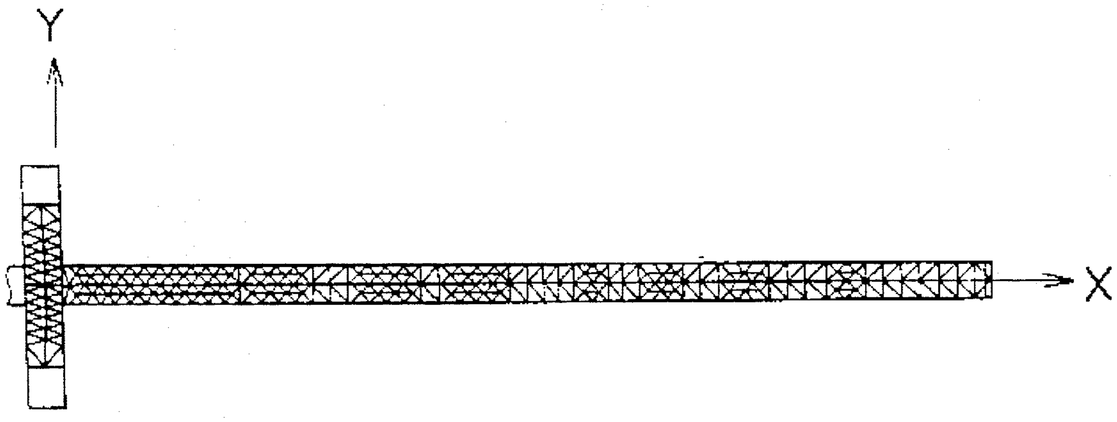
FIGS. 13(*a*) and 13(*b*) illustrate displacement distribution in the structure shown in FIG. 11 and absolute values of amounts of displacement in respective portions along an X-axis direction respectively.
Figure 13:
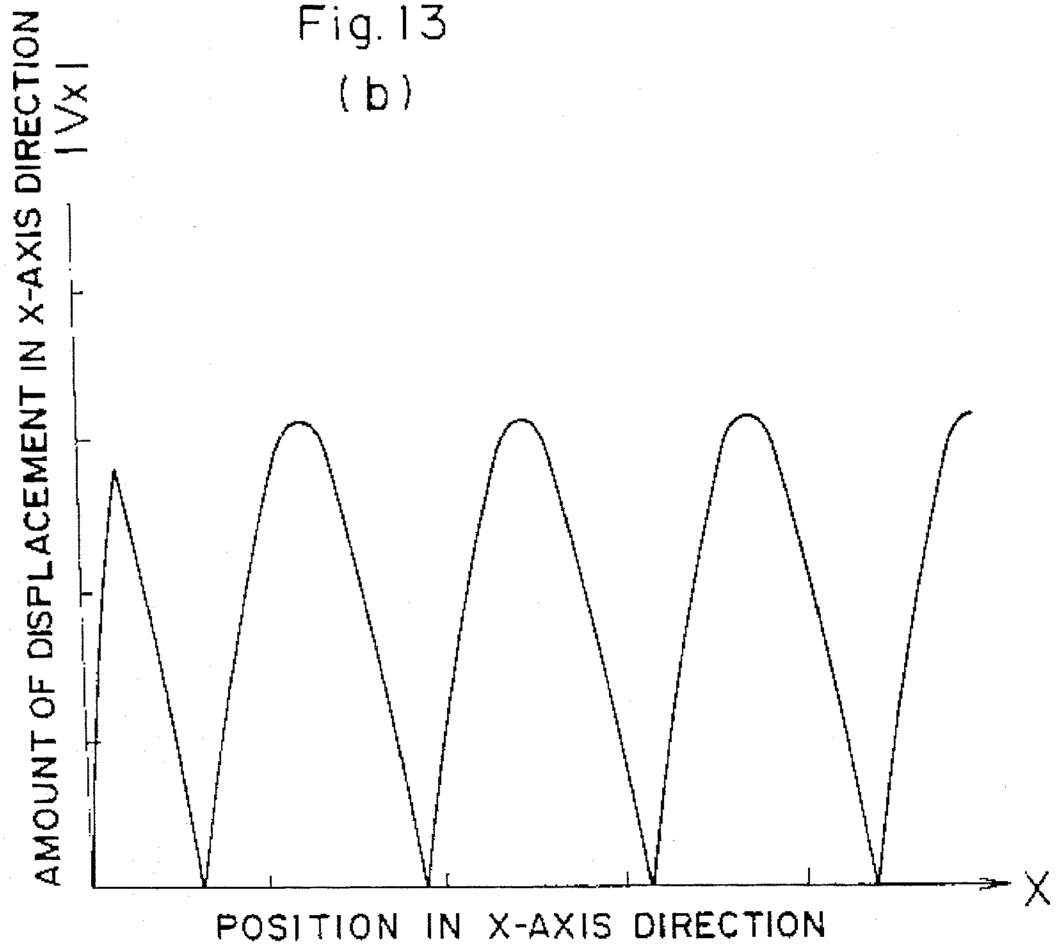

FIG. 12 shows a structure, which is similar to that shown in FIG. 13, provided with a resonant part 57. In the structure shown in FIG. 12, the resonant part 57 is coupled to a piezo-resonance unit 55 through a vibration transfer part 58, while a bar 59 is coupled to a surface of the resonant part 57 which is opposite to that coupled with the vibration transfer part 58. In other words, the resonant part 57 is formed in an intermediate position of a portion formed by the vibration transfer part 58 and the bar 59. In the structure shown in FIG. 12, components similar to the above are also coupled to the other side surface of the piezo-resonance unit 55.

Figure 15:
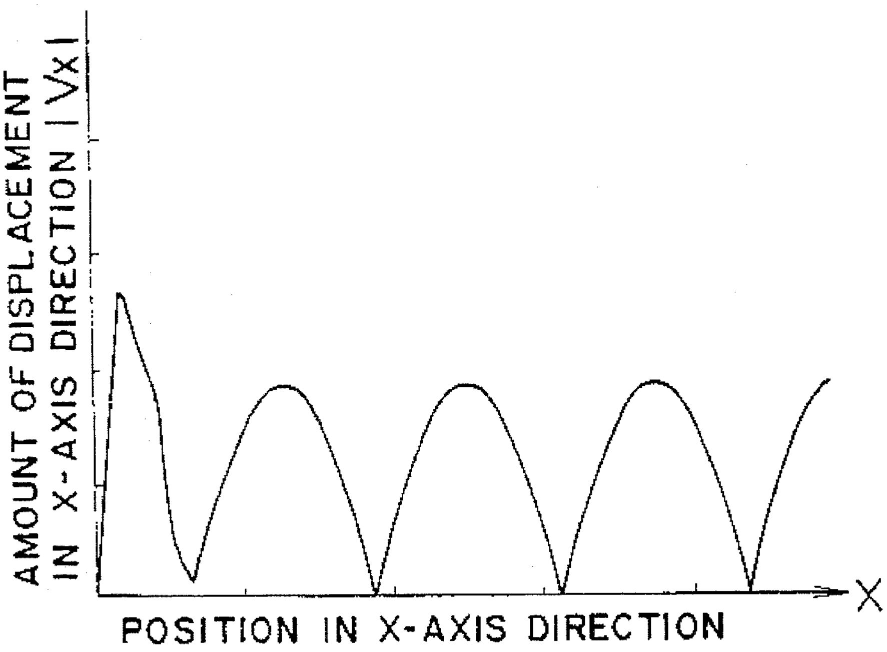
FIG. 15 illustrates absolute values of amounts of displacement in an X-axis direction in respective portions along the X-axis direction, which were measured when vibrational energy based on fundamental harmonic resonance of a piezo-resonance unit was transferred to a resonant part and the resonant part resonated in fundamental harmonic vibration of a bending mode.

FIG. 13(*a*) shows displacement distribution in the piezo-resonator shown in FIG. 11, which was caused when the piezo-resonance unit 55 is allowed to vibrate in a longitudinal vibration mode, and FIG. 15(*b*) shows absolute values $V_X$ of amounts of displacement in an X-axis direction in the respective portions along the longitudinal direction the bar 56, i.e., on the X-axis.

Figure 14:
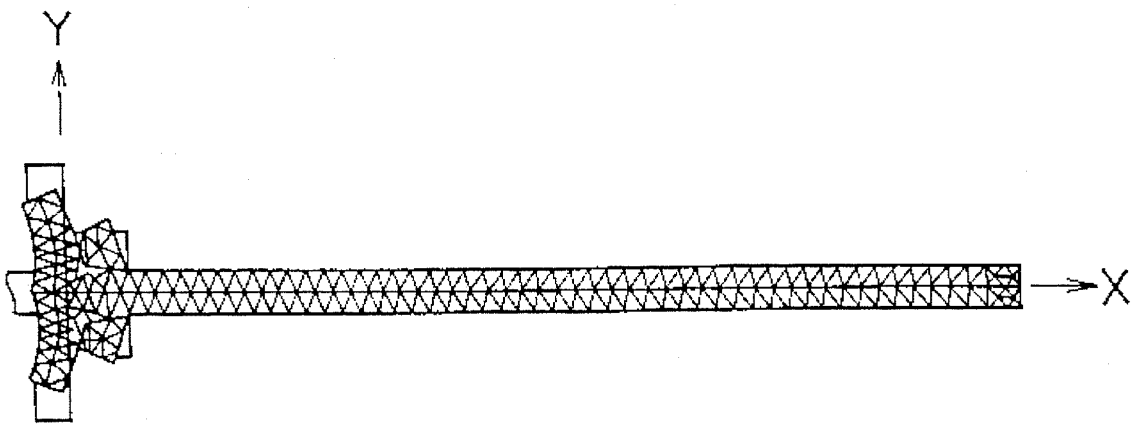
FIG. 14 illustrates displacement distribution in the structure shown in FIG. 12.

On the other hand, FIG. 14 shows displacement distribution which was caused when the piezo-resonance unit 55 was allowed to resonate in the piezo-resonator shown in FIG. 12. Further, FIG. 15 shows absolute values $V_X$ of amounts of displacement in an X-axis direction in the respective portions on the X-axis.

Comparing FIGS. 13(*b*) and 15 with each other, it is clearly understood that the amounts of displacement caused by propagated vibration were extremely reduced in the portion of the bar 59 located beyond the resonant part 57, due to the provision of the resonant part 57. In other words, it is understood that vibrational energy can be effectively trapped in a portion up to the resonant part 57.

Description is now made on the fact that vibrational energy can be effectively trapped in a portion up to a resonant part when the resonance frequency of the resonant part is substantially identical to that of a piezo-resonance unit, with reference to FIGS. 15 to 28.

As hereinabove described, the structure shown in FIG. 12 exhibits displacement distribution shown in FIG. 14 when the piezo-resonance unit 55 is allowed to vibrate. Such displacement distribution shown in FIG. 14 is attained when the piezo-resonance unit 55 and the resonant part 57 resonate in fundamental harmonic vibration respectively.

FIGS. 15 to 20 illustrate absolute values of amounts of displacement in X-axis directions in respective portions along the X-axis directions in piezo-resonators provided with piezo-resonance units 55 of 0.6 mm in width, 4.0 mm in length and 0.4 mm in thickness having resonance frequencies of 422 kHz with changes of widths W and lengths l (see FIG. 12) of resonant parts 57.

Figure 16:
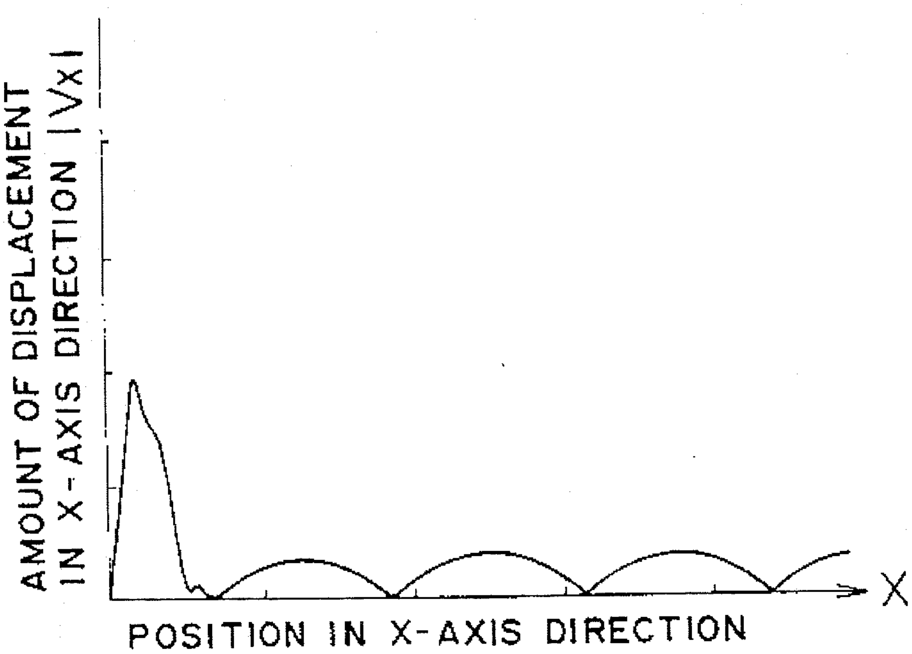
FIG. 16 illustrates absolute values of amounts of displacement in an X-axis direction in respective portions along the X-axis direction, which were measured when a piezo-resonance unit and a resonant part resonated at fundamental harmonic resonance frequencies being in agreement with each other.
Figure 17:
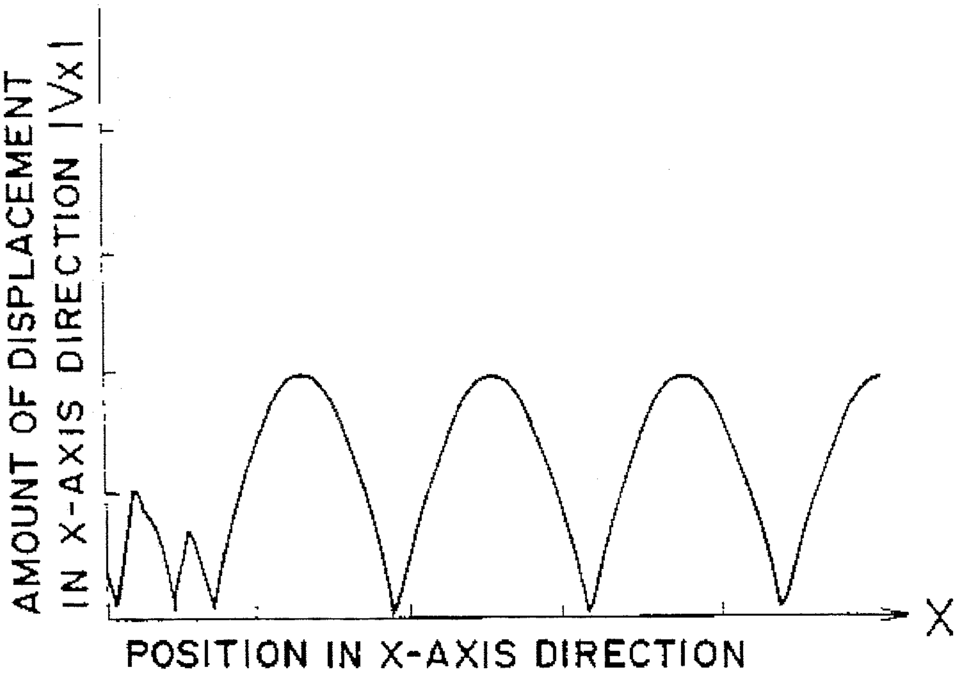
FIG. 17 illustrates absolute values of amounts of displacement in an X-axis direction in respective portions along the X-axis direction, which were measured when a piezo-resonance unit and a resonant part resonated in fundamental harmonic vibration.
Figure 18:
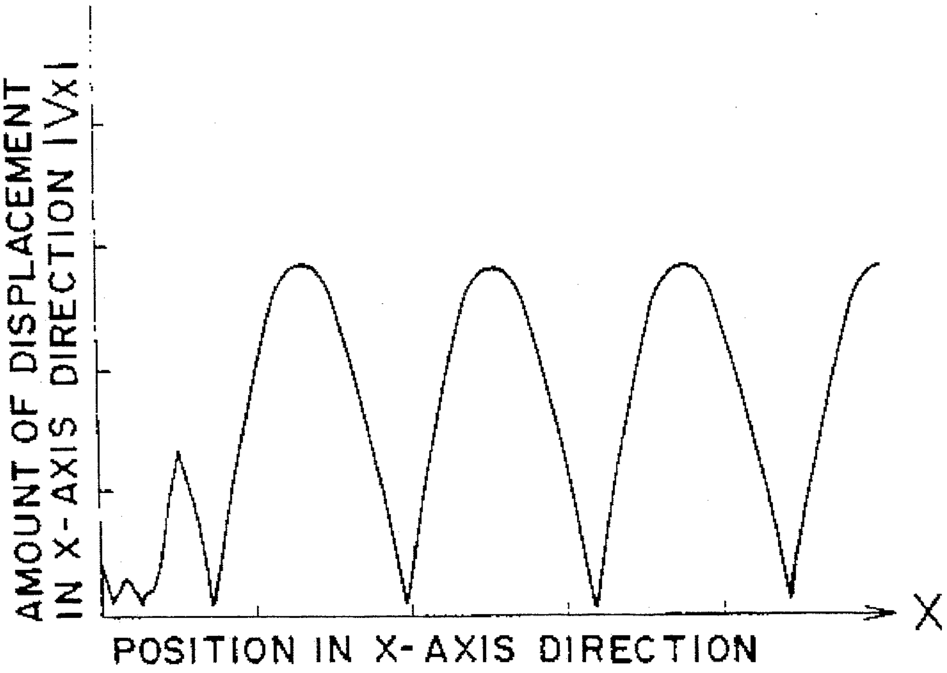
FIG. 18 illustrates absolute values of amounts of displacement in an X-axis direction in respective portions along the X-axis direction, which were measured when a piezo-resonance unit and a resonant part resonated in fundamental harmonic vibration.
Figure 20:
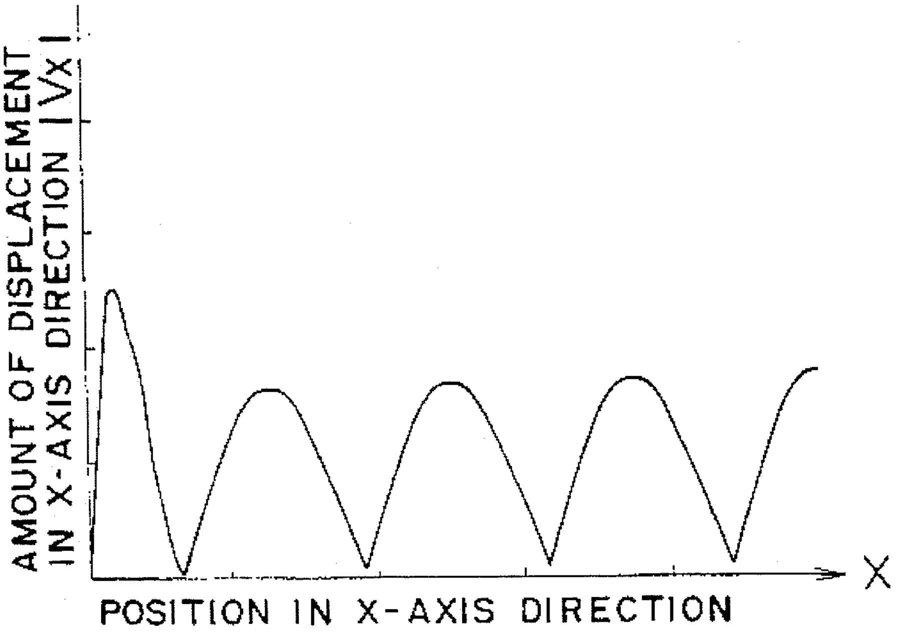
FIG. 20 illustrates absolute values of amounts of displacement in an X-axis direction in respective portions along the X-axis direction, which were measured when a piezo-resonance unit and a resonant part resonated in fundamental harmonic vibration.
Figure 38:
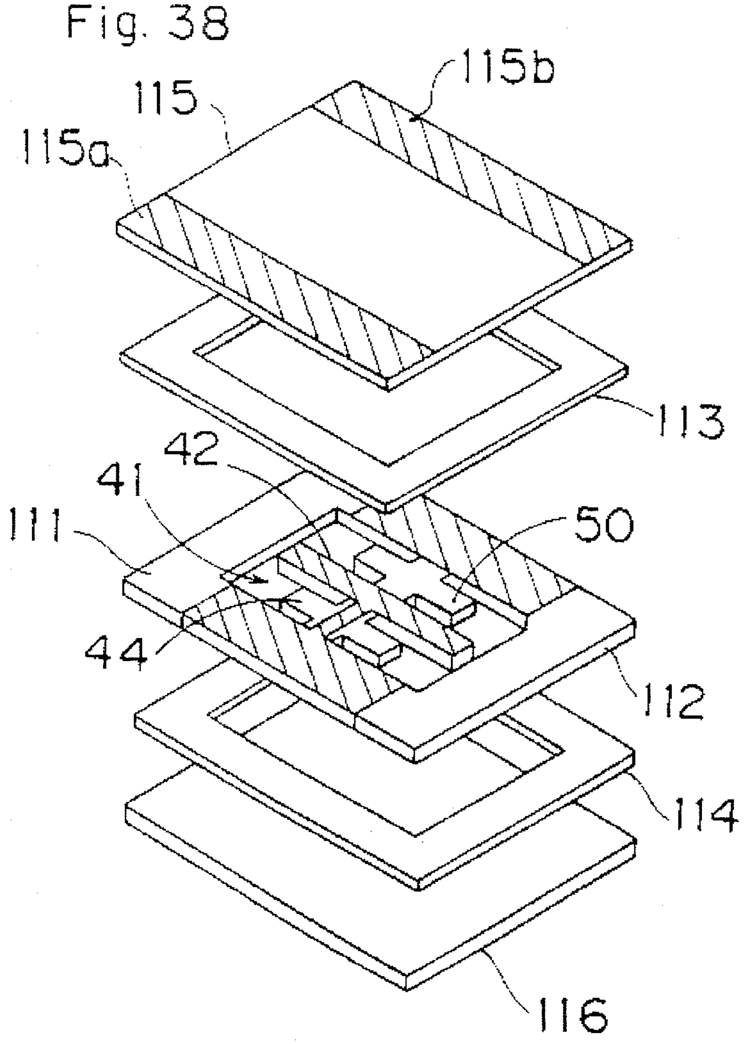
FIG. 38 is an exploded perspective view showing a chip-type piezo-resonance component formed with the piezo-resonator according to the second embodiment of the present invention.

FIGS. 15 to 17 illustrate absolute values of amounts of displacement with resonant parts 57 having lengths l of 0.70 mm and widths W of 0.55 mm, 0.65 mm and 0.75 mm respectively, while FIGS. 38 to 20 illustrate those with resonant parts 57 having widths W of 0.65 mm and lengths l of 0.65 mm, 0.70 mm and 0.75 mm respectively. The lengths l and widths W of the resonant parts 57 were so varied as to change the resonance frequencies of the resonant parts 57.

Comparing the data shown in FIG. 15 to 20 with that shown in FIG. 13(*b*), it is understood that propagated vibrational energy can be canceled by any of the resonant parts 57 having the aforementioned dimensions.

Figure 19:
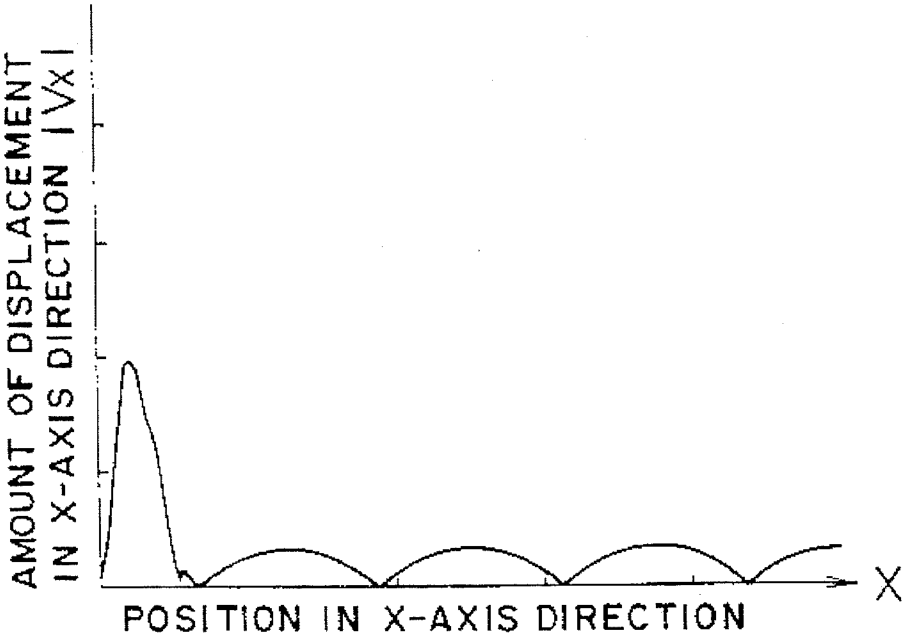
FIG. 19 illustrates absolute values of amounts of displacement in an X-axis direction in respective portions along the X-axis direction, which were measured when a piezo-resonance unit and a resonant part resonated in fundamental harmonic vibration.

It is also understood that the propagated vibrational energy can be further effectively canceled by action of the resonant part 57 in each of the structures shown in FIGS. 16 and 19. This is conceivably because the propagated vibrational energy was effectively canceled by a dynamic vibration absorbing phenomenon since the resonance frequency of the resonant part 57 was substantially identical to that of the piezo-resonance unit 55.

Figure 21:
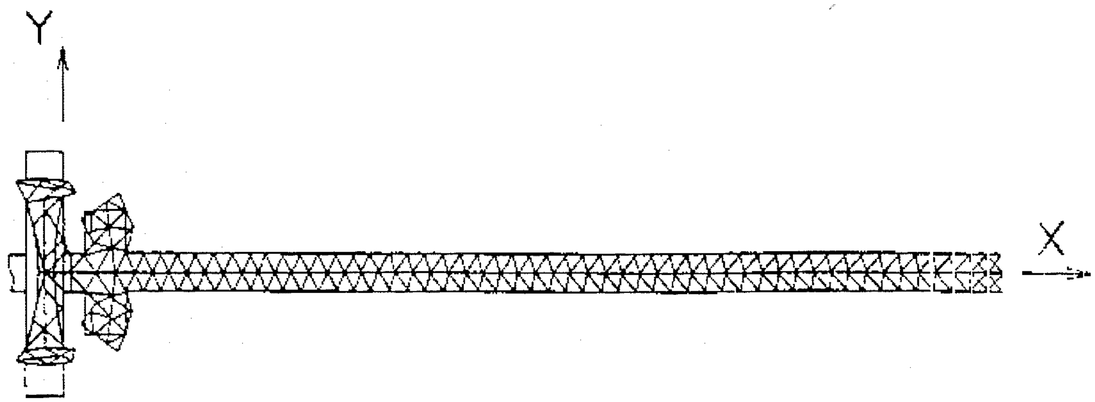
FIG. 21 illustrates displacement distribution caused when both of a piezo-resonance unit and a resonant part resonated in third harmonic vibration.
Figure 22:
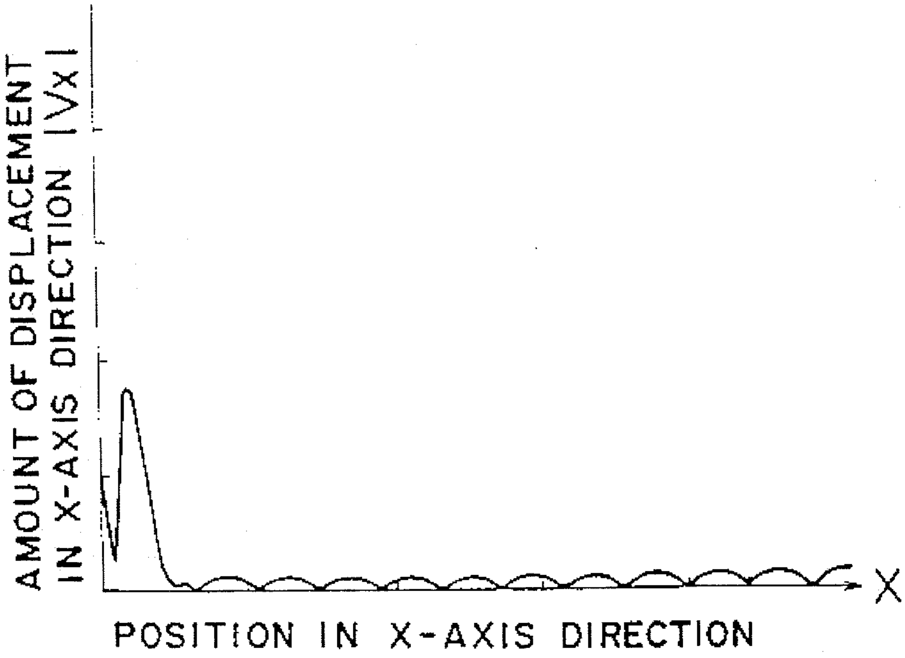
FIG. 22 illustrates absolute values of amounts of displacement along an X-axis direction in respective portions along the X-axis direction, which were measured when a piezo-resonance unit and a resonant part resonated in the manner shown in FIG. 21.
Figure 23:
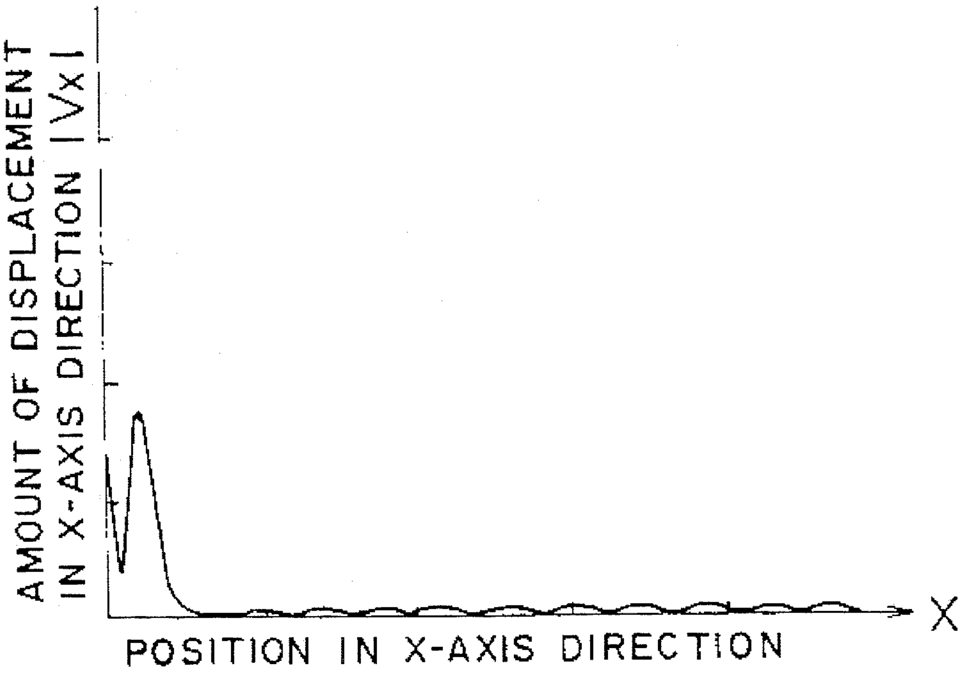
FIG. 23 illustrates absolute values of amounts of displacement along an X-axis direction in respective portions along the X-axis direction, which were measured when a piezo-resonance unit and a resonant part resonated in the manner shown in FIG. 21.
Figure 24:
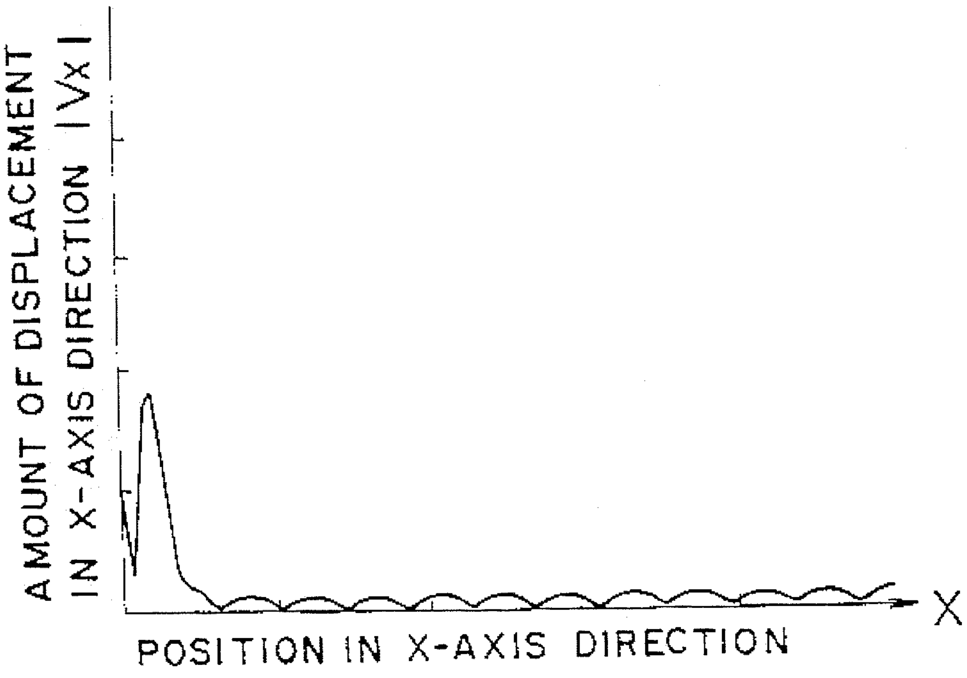
FIG. 24 illustrates absolute values of amounts of displacement along an X-axis direction in respective portions along the X-axis direction, which were measured when a piezo-resonance unit and a resonant part resonated in the manner shown in FIG. 21.

Description is now made on action of the resonant part 57 attained when the piezo-resonance unit 55 and the resonant part 57 resonate in third harmonic vibration in the structure shown in FIG. 12. FIG. 21 shows displacement distribution which was caused when the piezo-resonance unit 55 resonated in third harmonic vibration and the resonant part 57 resonated in third harmonic vibration of a bending mode. The piezo-resonance unit 55 employed in this case was 4.0 mm in length, 0.6 mm in width and 0.4 mm in thickness, to resonate at a third harmonic resonance frequency of 1237 kHz. FIGS. 22 to 24 illustrate absolute values of amounts of displacement along X-axis directions with resonant parts 57 having lengths l of 0.70 mm and widths W of 0.55 mm, 0.65 mm and 0.75 mm respectively.

Comparing FIGS. 22 to 24 with each other, it is understood that vibrational energy was most effectively canceled in the case of FIG. 23, conceivably because the resonance frequency of the resonant part 57 was identical to that of the piezo-resonance unit 55.

Figure 25:
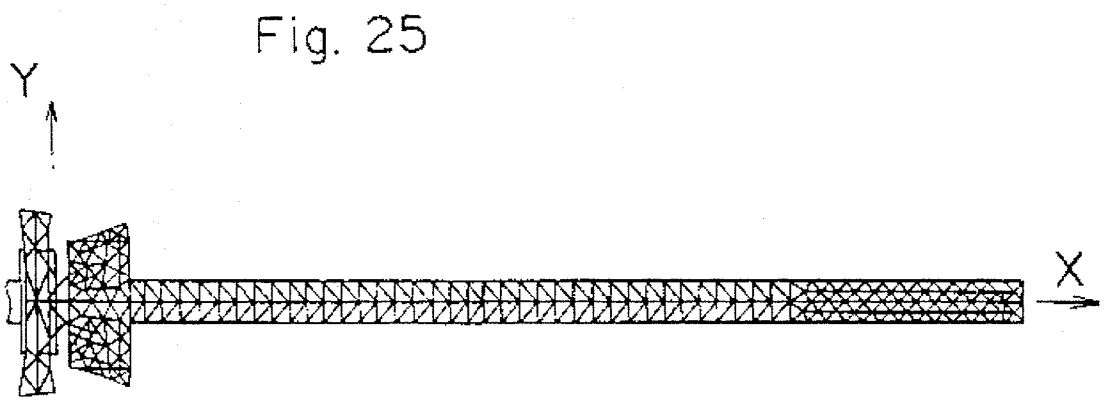
FIG. 25 illustrates displacement distribution caused when a piezo-resonance unit resonated in fundamental harmonic vibration and a resonant part vibrated in third harmonic vibration of a bending mode.

Description is now made on piezo-resonance units 55 resonating in fundamental harmonic vibration and resonant parts 57 resonating in third harmonic vibration. FIG. 25 illustrates displacement distribution of this case measured by a finite element method.

Figure 26:
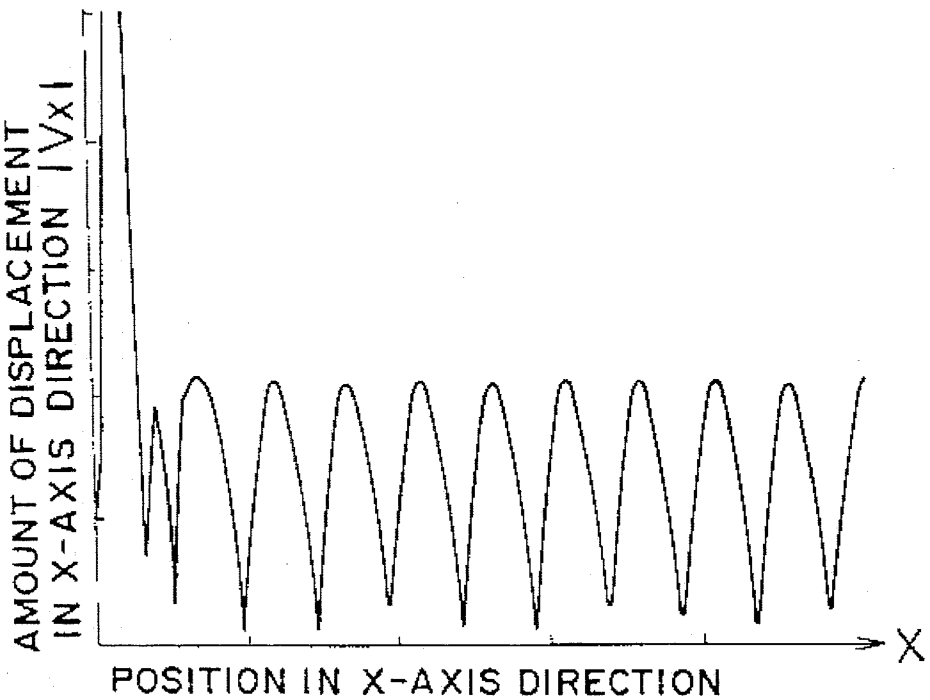
FIG. 26 illustrates absolute values of amounts of displacement along an X-axis direction in respective portions along the X-axis direction, which were measured when a piezo-resonance unit resonated in fundamental harmonic vibration and a resonant part resonated in third harmonic vibration.
Figure 27:
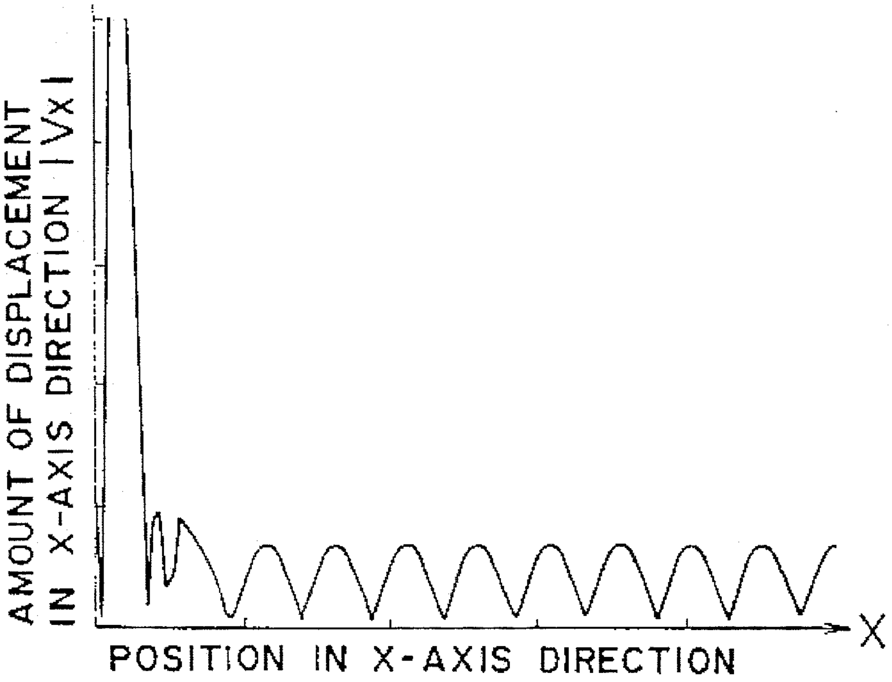
FIG. 27 illustrates absolute values of amounts of displacement along an X-axis direction in respective portions along the X-axis direction, which were measured when a piezo-resonance unit resonated in fundamental harmonic vibration and a resonant part resonated in third harmonic vibration.
Figure 28:
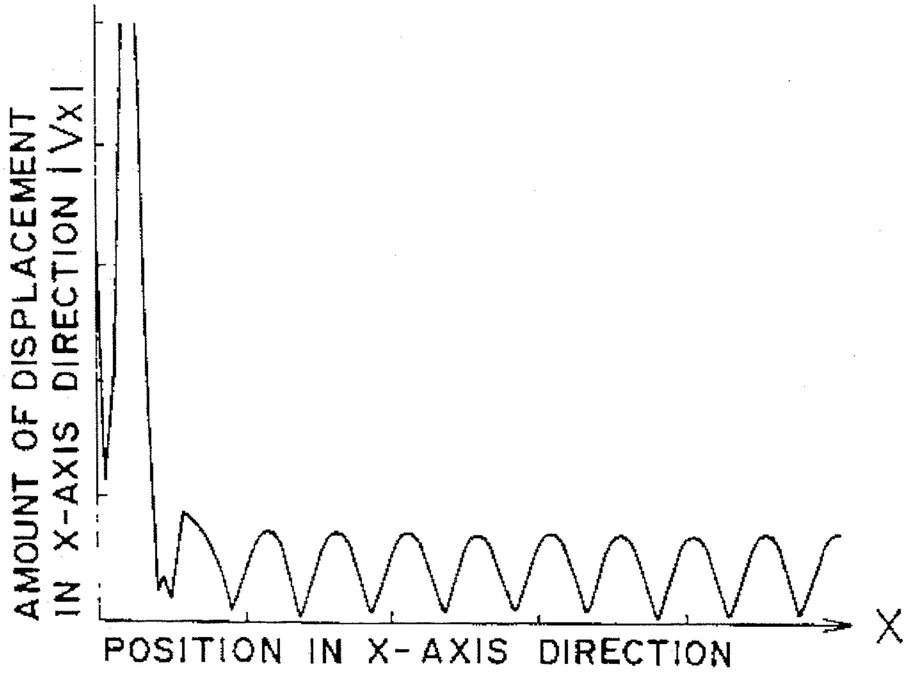
FIG. 28 illustrates absolute values of amounts of displacement along an X-axis direction in respective portions along the X-axis direction, which were measured when a piezo-resonance unit resonated in fundamental harmonic vibration and a resonant part resonated in third harmonic vibration.

Suppose that the piezo-resonance units 55 herein employed were 1.6 mm in length, 0.6 mm in width and 0.4 mm in thickness, with resonance frequencies of 1072 kHz. FIGS. 26 to 28 illustrate absolute values of amounts of displacement along X-axis directions with resonant parts 57 having widths W of 1.0 mm and lengths l of 0.65 mm, 0.70 mm and 0.75 mm respectively.

Comparing FIGS. 26 to 28 with each other, it is clearly understood that propagated vibrational energy was effectively canceled by a dynamic vibration absorbing phenomenon in the case of FIG. 27, conceivably because the fundamental harmonic resonance frequency of the piezo-resonance unit 55 was in agreement with the third harmonic resonance frequency of the resonant part 57.

Thus, it is understood that the piezo-resonance unit and the resonant part may resonate at either fundamental harmonic or third harmonic resonance frequencies.

According to the present invention, the resonant part is coupled to a portion of the vibration transfer part other than its node. Thus, propagated vibration is further effectively canceled by the resonant part. Description is now made on this point with reference to FIGS. 29 to 33.

Figure 29:
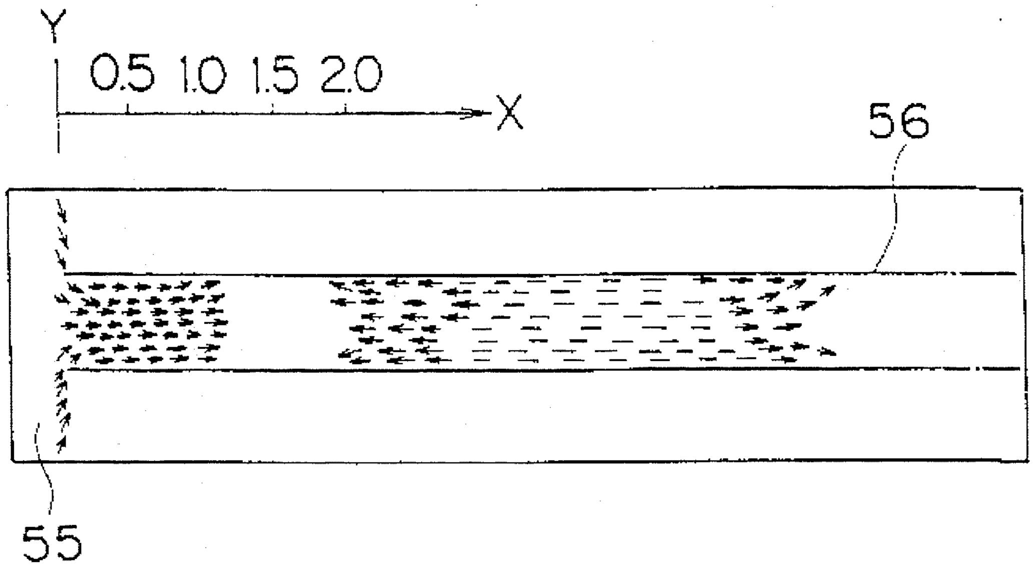
FIG. 29 illustrates a state of displacement of a vibration transfer part in the structure shown in FIG. 12.
Figure 30:
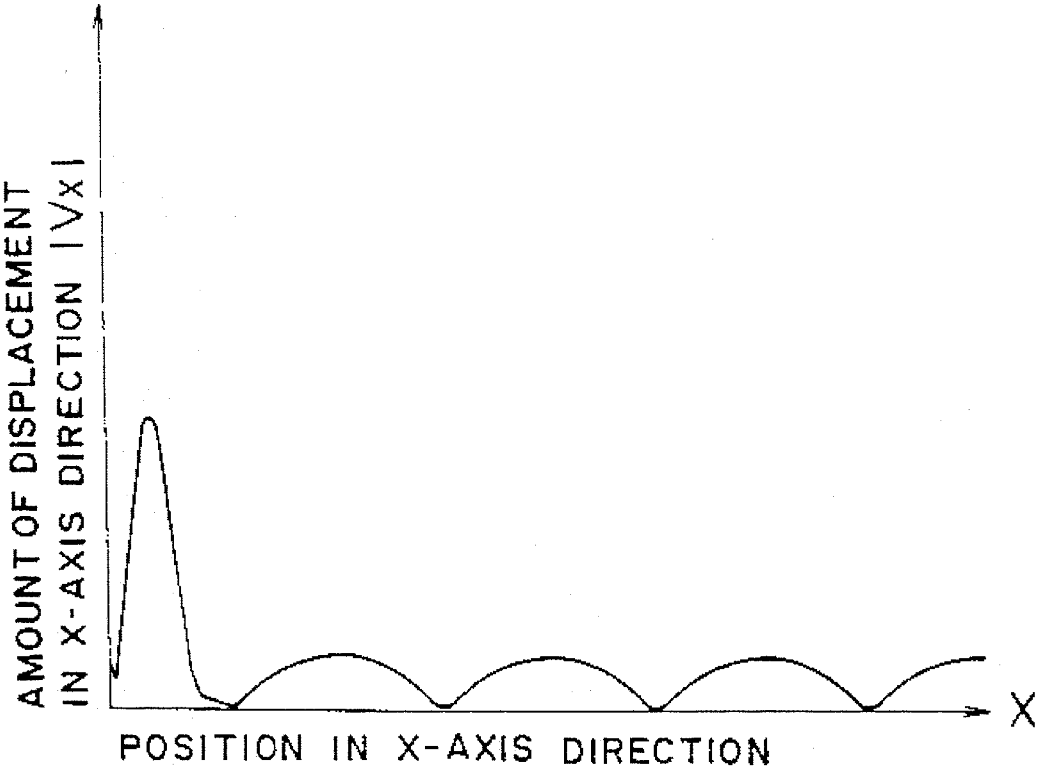
FIG. 30 illustrates absolute values of amounts of displacement in an X-axis direction in respective portions along the X-axis direction, which were measured when a distance P appearing in FIG. 12 was 0.5.
Figure 31:
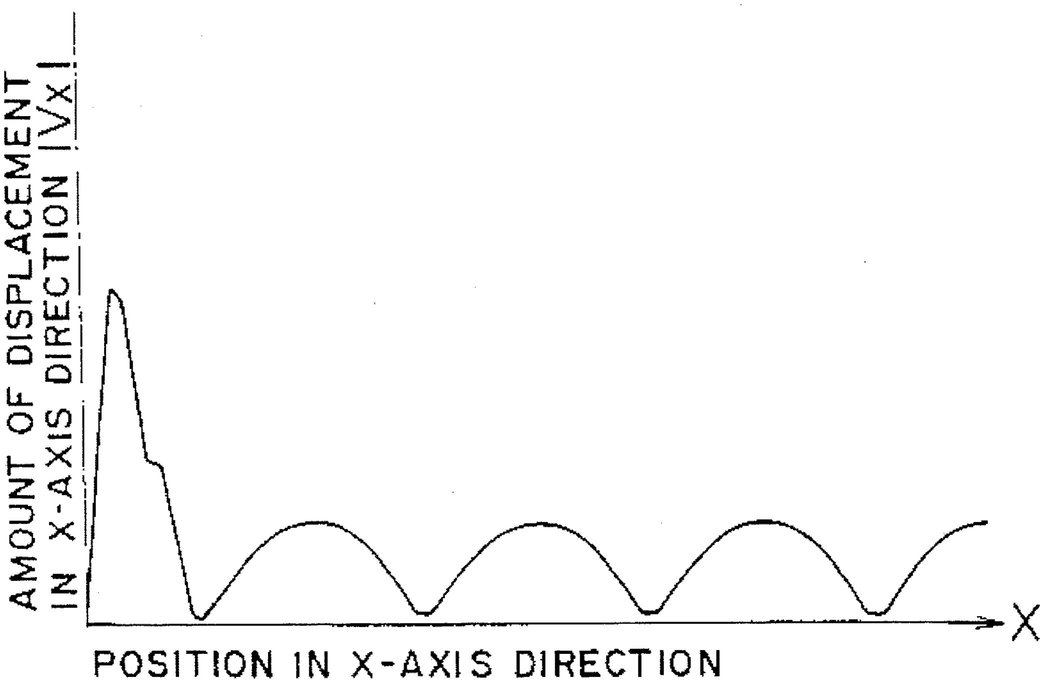
FIG. 31 illustrates absolute values of amounts of displacement in an X-axis direction in respective portions along the X-axis direction, which were measured when the distance P appearing in FIG. 12 was 1.0.

When the piezo-resonance unit 55 is allowed to resonate in the structure shown in FIG. 11, its vibration leaks to the bar 58. FIG. 29 illustrates displacement vectors appearing in the bar 56 in an enlarged manner. In other words, the bar 56 is displaced by the as-propagated vibration (longitudinal wave) as shown in FIG. 29 (arrows appearing in FIG. 29 show the displacement vectors).

As clearly understood from FIG. 29, the bar 56 has a portion which is extremely displaced by the propagated vibration, and a hardly displaced portion, i.e., a node. Namely, it is understood that the bar 56 is extremely displaced in a portion at a relative point 0.5 and hardly displaced in a portion at a relative point 1.5 along the X-axis direction, as shown in FIG. 29.

As to the piezo-resonator shown in FIG. 12, the action of the resonant part 57 was confirmed by varying a distance P between the side surface of the piezo-resonance unit 55 and the center of the resonant part 57.

FIGS. 30 to 33 illustrate absolute values of amounts of displacement in X-axis directions in respective portions along the X-axis directions measured in piezo-resonators having distances P of 0.5, 1.0, 1.5 and 2.0 respectively. It is understood from FIG. 32 that vibration of a considerable level was propagated to a portion beyond the resonant part 57. This means that the vibration cannot be sufficiently canceled by resonance when the resonant part 57 is coupled to the position at the distance P of 1.5, i.e., a node. On the other hand, it is also understood that the amounts of leakage of vibration to portions beyond the resonant parts were extremely small in FIG. 30 (distance P=0.5), FIG. 31 (distance P=1.0) and FIG. 33 (distance P=2.0). Thus, it is understood that the resonant part is preferably coupled to a portion of the vibration transfer part other than its node in the present invention, so that the as-propagated vibration can be effectively canceled by the resonant part.

Figure 32:
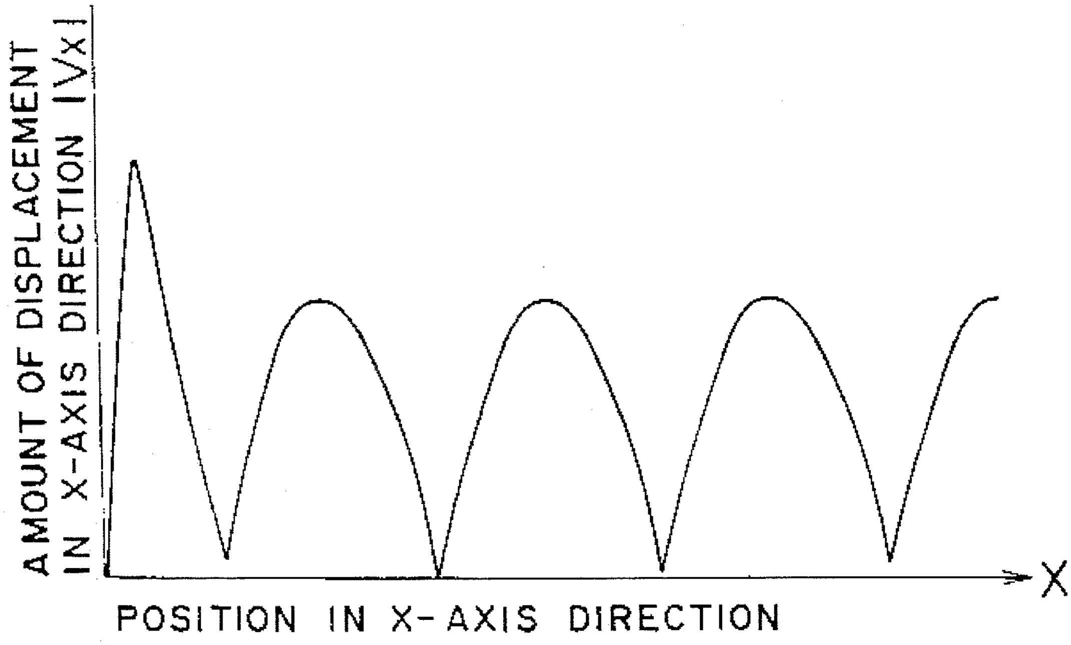
FIG. 32 illustrates absolute values of amounts of displacement in an X-axis direction in respective portions along the X-axis direction, which were measured when the distance P appearing in FIG. 12 was 1.5 (node)
Figure 33:
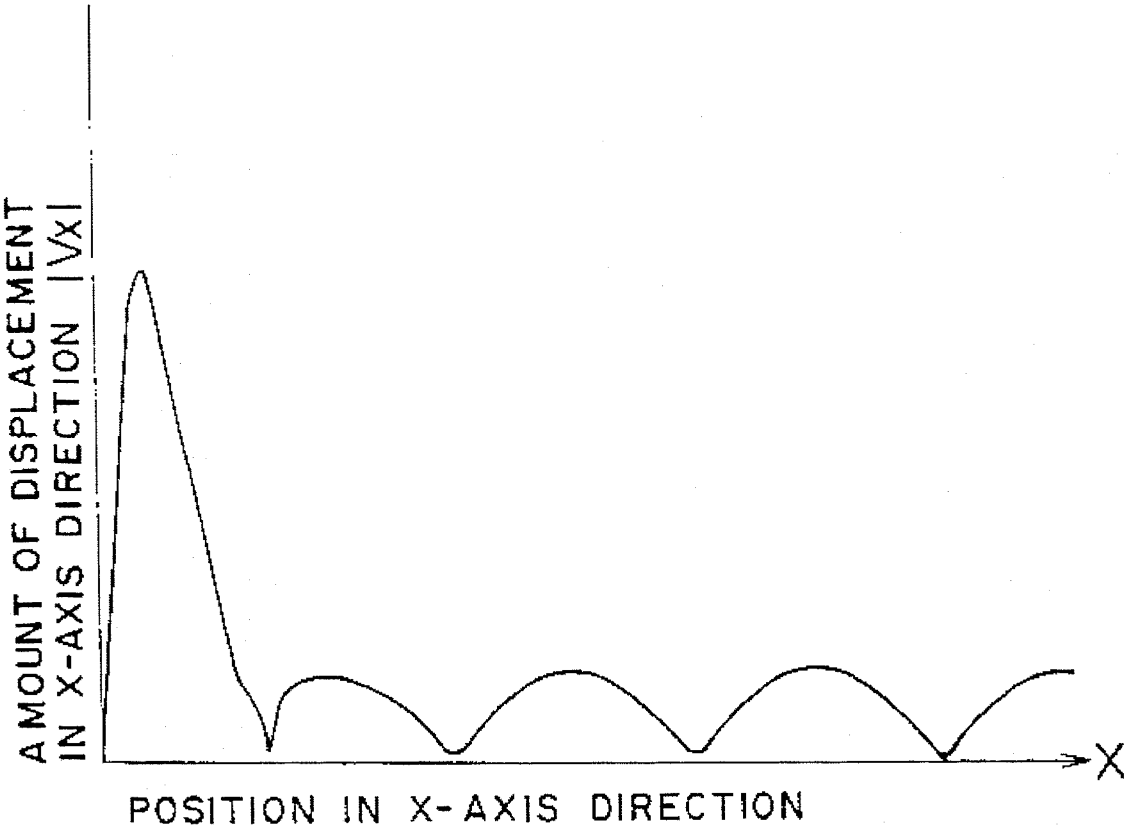
FIG. 33 illustrates absolute values of amounts displacement in an X-axis direction in respective portions along the X-axis direction, which were measured when the distance P appearing in FIG. 12 was 2.0.
Figure 34:
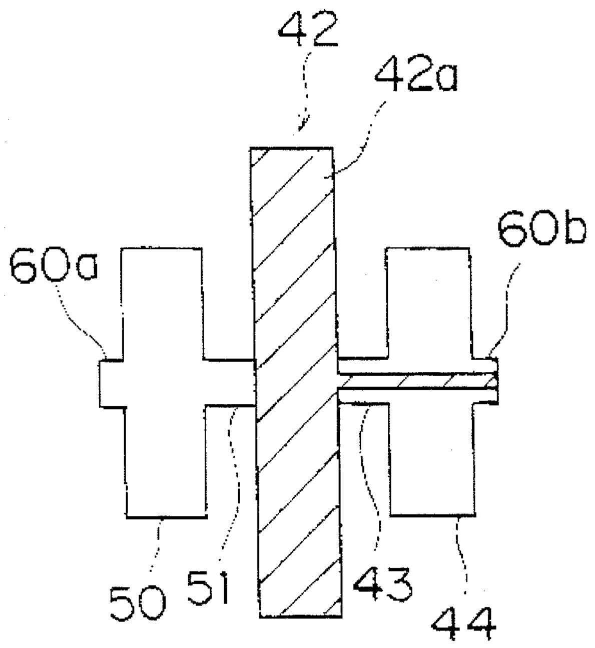
FIG. 34 is a plan view showing a modification of the piezo-resonator according to the second embodiment of the present invention.
Figure 35:
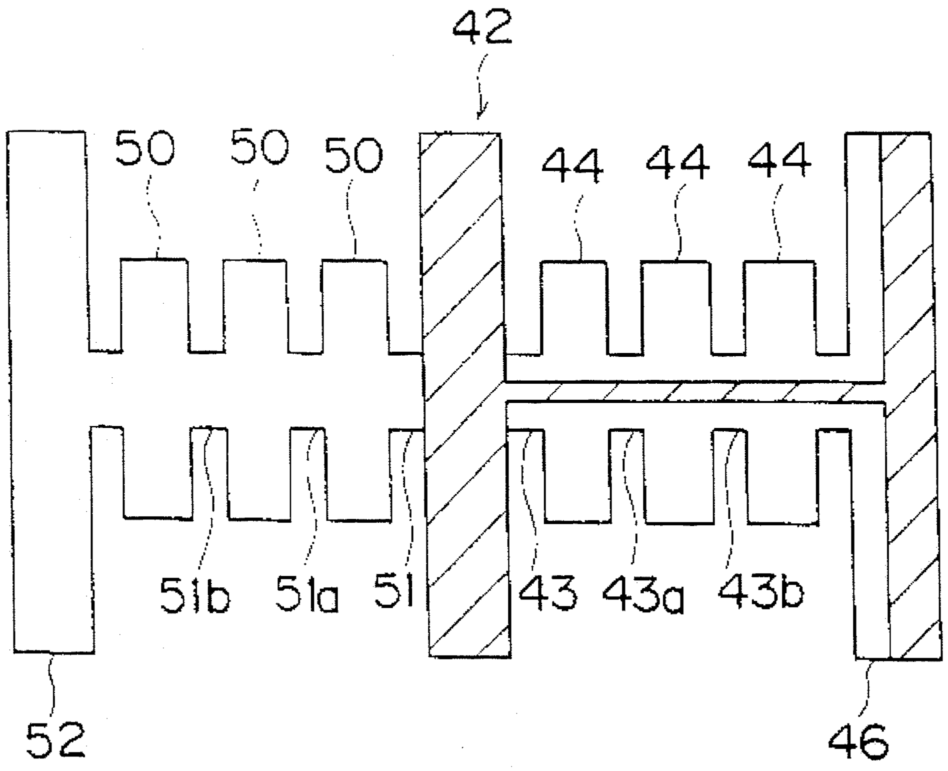
FIG. 35 is a plan view showing another modification of the piezo-resonator according to the second embodiment of the present invention, provided with a plurality of resonant parts.

Comparing FIG. 32 with FIG. 13(*b*), on the other hand, it is understood that leakage of vibration to the exterior was more or less suppressed even if the resonant part 57 was coupled to the node, as compared with the piezo-resonator shown in FIG. 11 having no resonant part.

While the holding parts 46 and 52 are coupled to outer sides of the resonant parts 44 and 50 through the coupling bars 45 and 51 in the piezo-resonator 41 according to the second embodiment shown in FIGS. 10(*a*) and 10(*b*), these parts are merely adapted to facilitate mechanical fixing of the piezo-resonator 41 in production. When coupling parts 60*a* and 60*b* for coupling with other portions are formed on sides of resonant parts 44 and 50 which are opposite to those coupled with vibration transfer parts 45 and 49 as shown in FIG. 54, vibrational energy can be trapped in portions up to the resonant parts 44 and 50 similarly to the second embodiment shown in FIGS. 10(*a*) and 10(*b*), whereby such a structure can be applied to an energy trap type piezo-resonator, similarly to the second embodiment.

While single resonant parts 44 and 50 are arranged on both sides of the piezo-resonance unit 42 in the piezo-resonator 41 according to the second embodiment shown in FIGS. 10(*a*) and 10(*b*), plural resonant parts 44 and 50 may be arranged on both sides of a piezo-resonance unit 42 respectively, as shown in FIG. 55. In this case, the plural resonant parts 44 and 50 are coupled with each other through vibration transfer parts 43*a*, 43*b*, 51*a* and 51*b*.

Embodiment as to Piezo-Resonator Utilizing Expansion Vibration Mode

FIGS. 56(*a*) and 56(*b*) are plan views showing a piezo-resonator according to a third embodiment of the present invention and an electrode provided on a lower side through a piezoelectric plate respectively.

The third embodiment is directed to a piezo-resonator 81 utilizing an expansion vibration mode of a rectangular plate. This piezo-resonator 81 has a piezo-resonance unit 82 which utilizes an expansion vibration mode of a rectangular plate. The piezo-resonance unit 82 is provided with a rectangular piezoelectric ceramic plate and electrodes 82*a* and 82*b* which are formed along overall major surfaces thereof, while the piezoelectric ceramic plate held between the electrodes 82*a* and 82*b* is uniformly polarized in the direction of its thickness.

The feature of the piezo-resonator 81 according to the third embodiment resides in such employment of the piezo-resonance unit 82 utilizing an expansion vibration mode. In other points, this piezo-resonator 81 is structured similarly to the piezo-resonator 41 according to the second embodiment. Therefore, parts of the piezo-resonator 81 shown in FIGS. 38(*a*) and 38(*b*) corresponding to those of the piezo-resonator 41 according to the second embodiment shown in FIGS. 10(*a*) and 10(*b*) are denoted by corresponding reference numerals, to omit redundant description.

In this piezo-resonator 81, an alternating voltage is applied across terminal electrodes 48*a* and 48*b*, so that the piezo-resonance unit 82 resonates in an expansion vibration mode. Also in this embodiment, the vibration of the piezo-resonance unit 82 is transferred to resonant parts 24 and 30 which are coupled to portions of vibration transfer parts 43 and 49 other than nodes thereof through the vibration transfer parts 43 and 49, whereby the resonant parts 44 and 50 resonate in bending modes at frequencies which are substantially identical to the resonance frequency of the piezo-resonance unit 82. Thus, the as-propagated vibration is canceled by such resonance of the resonant parts 44 and 50, so that the vibrational energy is trapped in portions up to the resonant parts 44 and 50.

Figure 36:
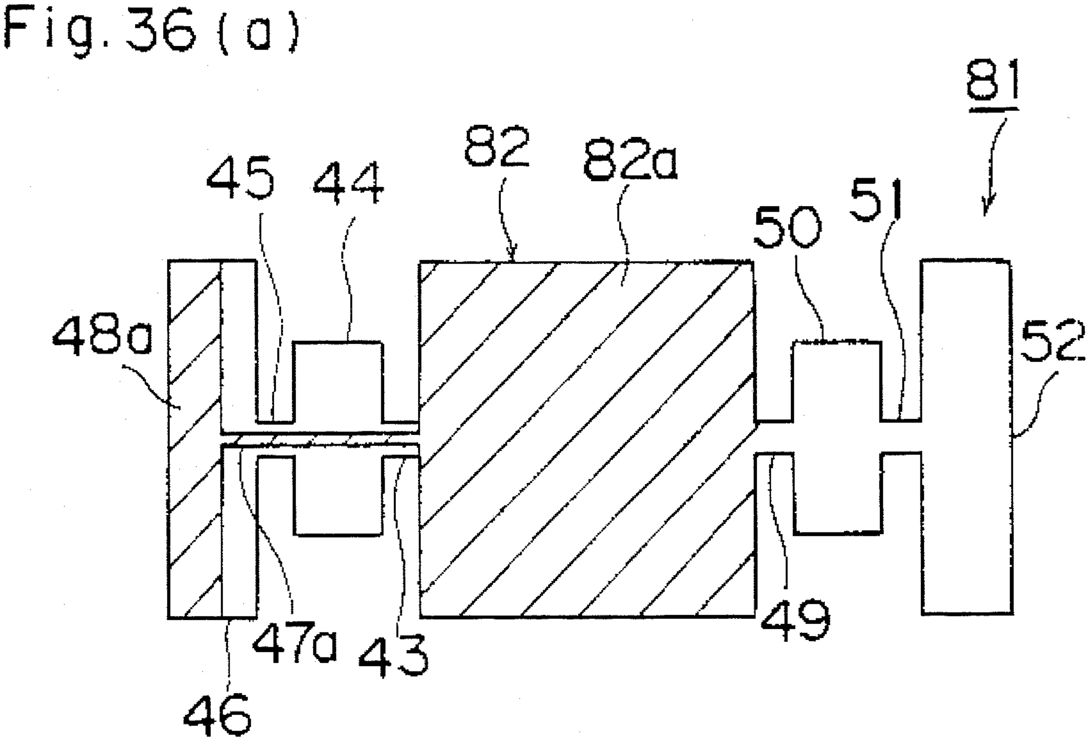
FIGS. 36(*a*) and 36(*b*) are a plan view of a piezo-resonator according to a third embodiment of the present invention and a typical plan view showing a shape of an electrode, provided on a lower surface, through a piezoelectric plate.
Figure 36:
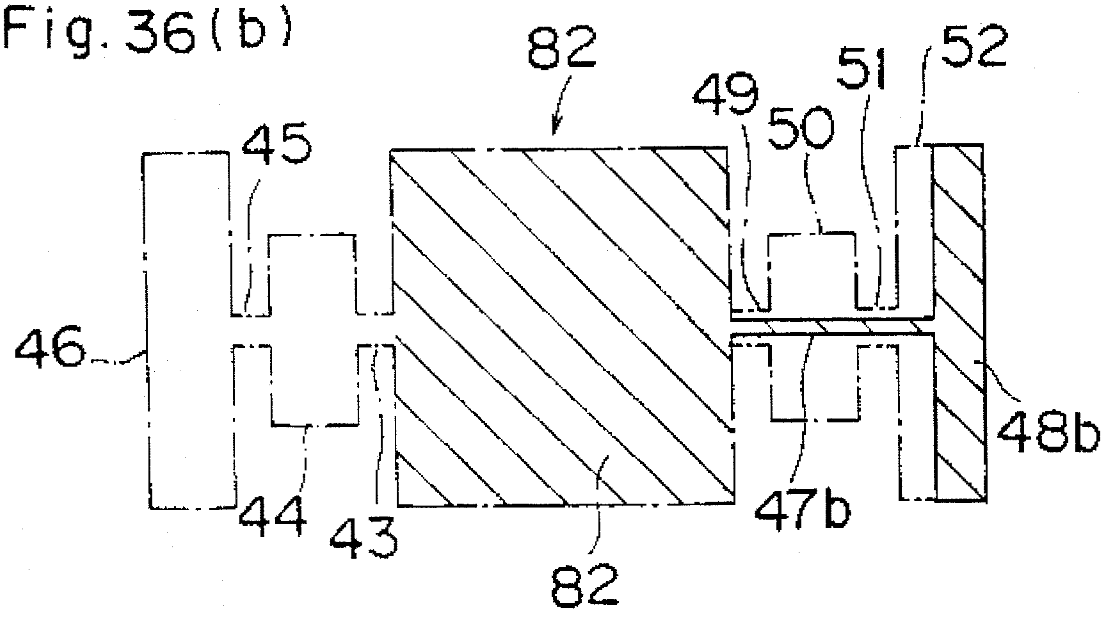

While the resonant parts 44 and 50 are coupled to both sides of the piezo-resonance unit 82 through the vibration transfer parts 43 and 49 in the piezo-resonator 81 shown in FIGS. 36(*a*) and 36(*b*), similar resonant parts capable of resonating in bending modes may be also coupled to upper and lower portions of the piezo-resonance unit 82 through similar vibration transfer parts.

In the piezo-resonator 81 according to the third embodiment of the present invention, as hereinabove described, a piezo-resonance unit capable of resonating in various vibration modes can be employed while vibrational energy can be reliably trapped in portions up to resonant parts by coupling the resonant parts through vibration transfer parts. Thus, it is possible to obtain a piezo-resonator of an energy trap type utilizing a vibration mode, vibrational energy of which has been impossible to trap in the prior art.

Applied Examples

Figure 37:
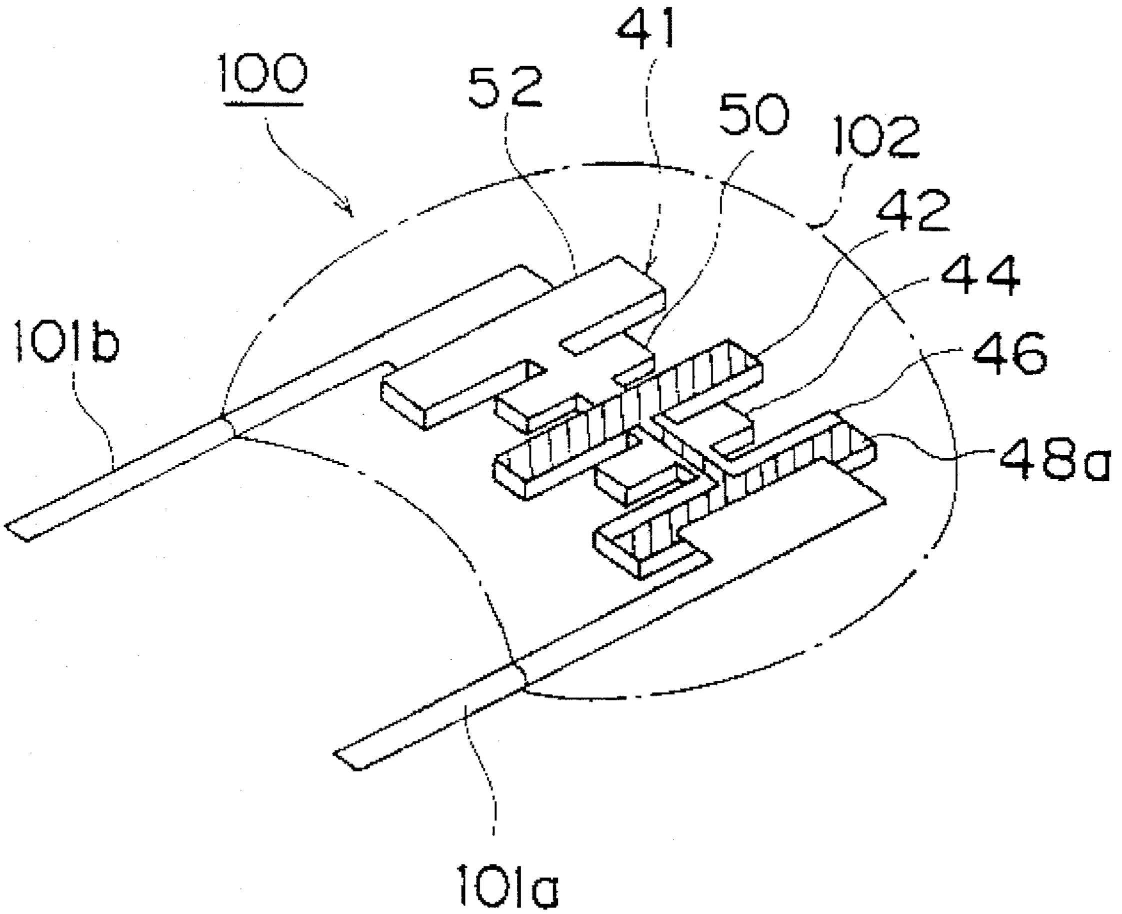
FIG. 37 is a perspective view showing an electronic component provided with lead terminals covered with a protective resin member, to which the piezo-resonator according to the second embodiment of the present invention is applied.

FIG. 37 is a schematic perspective view showing an example of the piezo-resonator according to the second embodiment, which is applied to a practical component. In such a piezo-resonance component 100, the piezo-resonator 41 shown in FIGS. 10(*a*) and 10(*b*) is formed as a component provided with lead terminals. A lead terminal 101*a* is bonded to a terminal electrode 48*a* which is formed on an upper surface of a holding part 46 of the piezo-resonator 41, while another lead terminal 101*b* is bonded to another terminal electrode (not shown) which is formed on a lower surface of another holding part 52. Portions except the forward end portions of the lead terminals 101*a* and 101*b* are covered with a protective resin member 102, as shown by one-dot chain lines appearing in FIG. 57. A cavity is defined in this protective resin member 102, not to inhibit vibrating portions such as the piezo-resonance unit 42 and the resonant parts 44 and 50 from vibration. Such a cavity can be defined by applying wax to the vibrating portions of the piezo-resonator 41, thereafter covering the same with the thermosetting protective resin member 102 and carrying out heat treatment.

Figure 39:
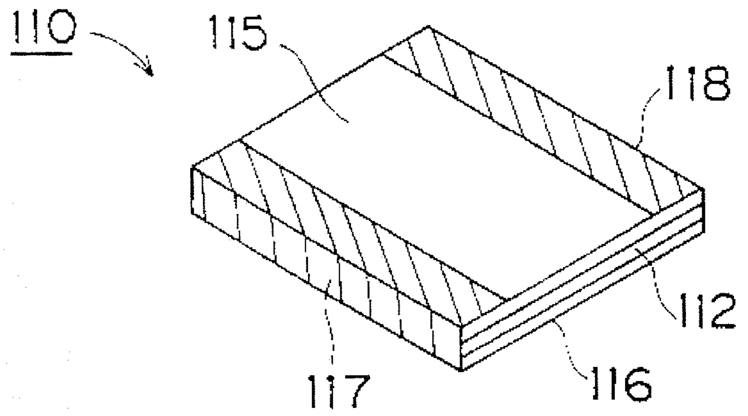
FIG. 39 is a perspective view showing a chip-type resonance component formed by the respective members shown in FIG. 38.

FIG. 38 is an exploded perspective view showing a chip-type piezo-resonance component 110 which is formed using the piezo-resonator 41 shown in FIGS. 10(*a*) and 10(*b*), and FIG. 39 is a perspective view showing the appearance of this chip-type piezo-resonance component 110.

In this piezo-resonance component 110, first and second spacer plates 111 and 112 are fixed to side portions of the piezo-resonator 41 shown in FIGS. 10(*a*) and 10(*b*) with an insulating adhesive or the like. The spacer plates 111 and 111 are formed to be substantially equal in thickness to the piezo-resonator 41.

Further, the first and second spacer plates 111 and 112 are separated from vibrating portions of the piezo-resonator 41, i.e., a piezo-resonance unit 42 and resonant parts 44 and 50, at prescribed spaces, not to be in contact with these portions, and not to inhibit these portions from vibration. The first and second spacer plates 111 and 112 are made of an insulating material such as insulating ceramics or synthetic resin, for example, having rigidity to some extent. Sheet adhesives 113 and 114 which are in the form of rectangular frames are stacked on upper and lower portions of the piezo-resonator 41 and the first and second spacer plates 111 and 112. The sheet-type adhesives 113 and 114 are adapted to stick case substrates 115 and 116 as described later to the piezo-resonator 41 and the first and second spacer plates 111 and 112.

The case substrates 115 and 116, which are made of insulating ceramics such as alumina or synthetic resin, for example, are stuck onto the piezo-resonator 41 and the first and second spacer plates 111 and 112 by the sheet-type adhesives 113 and 114.

The sheet-type adhesives 113 and 114 may be prepared from proper adhesives having rectangular frame shapes which can compression-bond the piezo-resonator 41 and the first and second spacer plates 111 and 112, being bonded to each other, with the case substrates 115 and 116, as shown in FIG. 38. Alternatively, adhesives may be applied to the lower surface of the case substrate 115 and the upper surface of the case substrate 116 in the form of rectangular frames having the same plane shapes as the sheet adhesives 113 and 114, to substitute for the sheet-type adhesives 113 and 114.

As hereinabove described, the sheet-type adhesives 113 and 114 are provided in the form of rectangular frames, in order to ensure spaces in portions above and under the piezo-resonator 41 for allowing vibration of the vibrating portions of the piezo-resonator 41.

It is clearly understood from FIG. 39 that first and second external electrodes 117 and 118 are formed to cover a pair of end surfaces of the chip-type piezo-resonance component 110 according to this embodiment, by vacuum deposition, sputtering, plating or application and baking of conductive paste.

In such formation of the first and second external electrodes 117 and 118, partial external electrodes 115*a* and 115*b* may be previously formed on the upper surface of the case substrate 115 as shown in FIG. 38 with formation of similar partial external electrodes on the lower surface of the case substrate 116, so that the external electrodes 117 and 118 are formed on a pair of end surfaces of such a laminate to electrically connect these partial external electrodes with each other on the end surfaces of the laminate.

Figure 40:
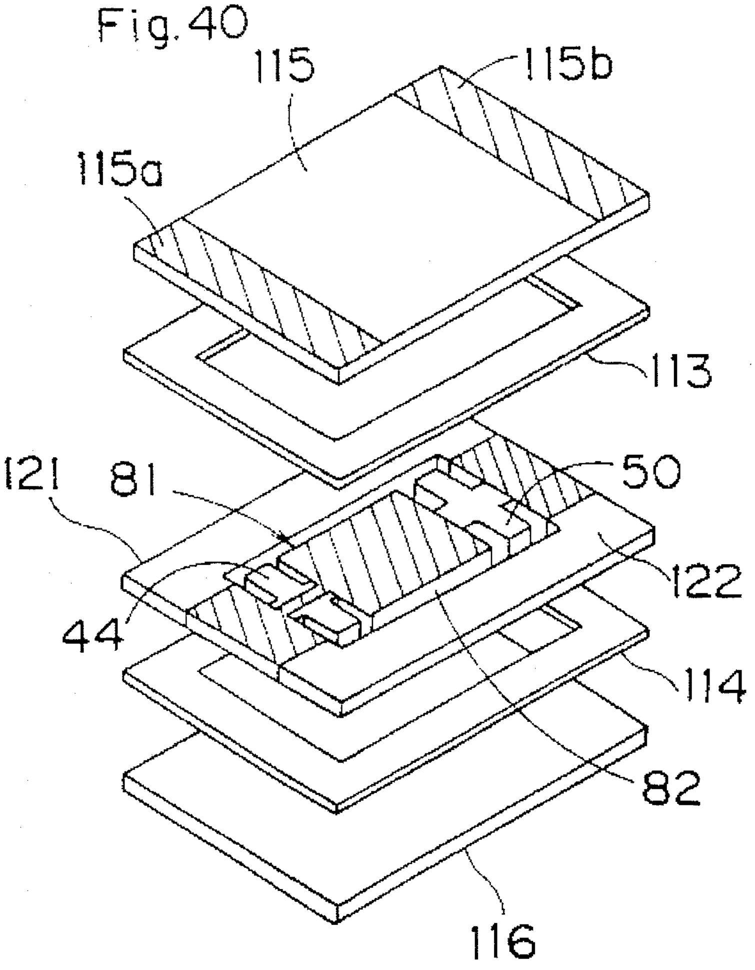
FIG. 40 is an exploded perspective view showing a chip-type piezo-resonance component formed by the piezo-resonator according to the third embodiment of the present invention.
Figure 41:
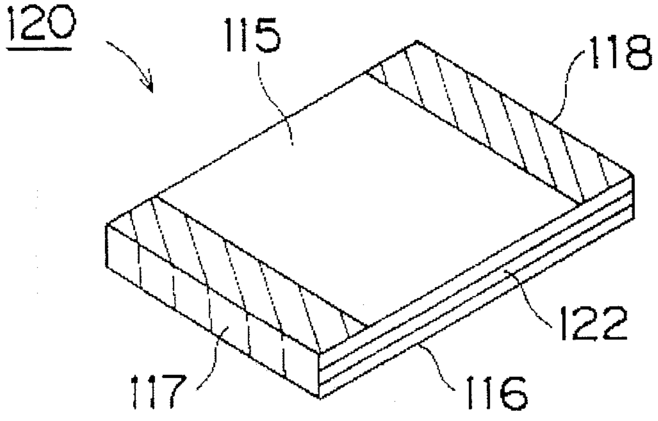
FIG. 41 is a perspective view showing the appearance of the chip-type resonance component formed by the piezo-resonator according to the third embodiment of the present invention.

FIGS. 40 and 41 are an exploded perspective view and a perspective view showing a chip-type piezo-resonance component 120 which is formed with the piezo-resonator 81 utilizing an expansion vibration mode shown in FIG. 36 and the appearance of the chip-type piezo-resonance component 120 respectively.

This chip-type piezo-resonance component 120 is structured in a similar manner to the chip-type piezo-resonance component 110 shown in FIG. 39, except that the piezo-resonator 81 is employed in place of the piezo-resonator 41 shown in FIG. 38 and first and second spacer plates 121 and 122.are bonded to side portions of the piezo-resonator 81. As to the detailed structure of the chip-type piezo-resonance component 120, therefore, the description on the chip-type piezoelectric component 110 is applied, to omit redundant description.

In the structures shown in FIGS. 38 and 40, the sheet-type adhesives 113 and 114 are employed to define spaces in the portions above and under the piezo-resonators 41 and 81 for allowing vibration, or adhesives are applied to the major surfaces of the case substrates to have the same plane shapes as the sheet type adhesives 113 and 114. Alternatively, cavities for allowing vibration of vibrating portions of the piezo-resonators 41 and 81 may be formed on the lower surfaces of the case substrates 115 and the upper surfaces of the case substrates 116, so that adhesives are applied to regions around the cavities or sheet-type adhesives in the form of rectangular frames are employed to bond the piezo-resonators 41 and 81 with the first and second spacer plates 111, 112, 121 and 122 and the case substrates 115 and 116.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A vibrating unit including a vibrator, and utilizing a dynamic vibration absorbing phenomenon to prevent inhibition of vibration of said vibrator, said vibrating unit comprising:

said vibrator that generates vibration, said vibrator including a portion having a minimum displacement during vibration of said vibrator;

a vibration transfer part coupled to said portion of said vibrator exhibiting the minimum displacement or to a portion of said vibrator close thereto, said vibration transfer part receiving and propagating said vibration from said vibrator;

a dynamic damper coupled to said vibration transfer part for receiving said propagated vibration of said vibrator to vibrate such that said propagated vibration is cancelled in accordance with the dynamic vibration absorbing phenomenon, said dynamic damper being structured and arranged to vibrate at a natural frequency that is substantially identical to a frequency of said vibration propagated from said vibrator.

2. A vibrating unit in accordance with claim 1, wherein said portion of said vibrator exhibiting minimum displacement is a node of vibration.

3. A vibrating unit in accordance with claim 1, comprising a plurality of said dynamic dampers.

4. A vibrating unit in accordance with claim 3, wherein said plurality of dynamic dampers are structured and arranged so as to differ from each other in at least either their respective natural frequencies or vibration modes.

5. A piezo-resonator comprising:

a piezo-resonance unit that generates vibration, said piezo-resonance unit including a portion having a minimum displacement during vibration of said piezo-resonance unit;

a vibration transfer part having an end coupled to said piezo-resonance unit at said portion having the minimum displacement or to a portion of said piezo-resonance unit close thereto, said vibration transfer part receiving and propagating said vibration from said piezo-resonance unit; and a dynamic damper coupled to said vibration transfer part for receiving said propagated vibration of said piezo-resonance unit to vibrate such that said propagated vibration is cancelled in accordance with a dynamic vibration absorbing phenomenon thereby preventing inhibition of said vibration of said piezo-resonance unit, said dynamic damper being structured and arranged to vibrate at a natural frequency that is substantially identical to a frequency of said vibration propagated from said piezo-resonance unit.

6. A piezo-resonator in accordance with claim 5, wherein said dynamic damper is structured and arranged to receive said propagated vibration of said piezo-resonance unit to vibrate in a bending vibration mode.

7. A piezo-resonator in accordance with claim 5, wherein said piezo-resonance unit vibrates in a longitudinal vibration mode, said vibration transfer part includes a node of vibration, said node of vibration vibrating by said vibration propagated from said piezo-resonance unit, and said dynamic damper is coupled to said vibration transfer part in a portion other than said node of vibration.

8. A piezo-resonator in accordance with claim 5, further comprising a coupling bar having an end coupled to said dynamic damper, and a holding part coupled to another end of said coupling bar.

9. A piezo-resonator in accordance with claim 5, wherein said piezo-resonance unit has a piezoelectric plate, and first and second excitation electrodes provided on said piezoelectric plate, and said vibration transfer part including first and second vibration transfer parts coupled to both sides of said piezo-resonance unit respectively, said dynamic damper including first and second dynamic dampers coupled to said first and second vibration transfer parts respectively and structured and arranged to receive said propagated vibration of said piezo-resonance unit to vibrate.

10. A piezo-resonator in accordance with claim 9, further comprising:

first and second coupling bars having first ends coupled to said first and second dynamic dampers respectively, first and second holding parts coupled to second ends of said first and second coupling bars respectively, first and second terminal electrodes provided on said first and second holding parts respectively, and first and second connecting conductive parts connecting said first and second terminal electrodes with said first and second excitation electrodes respectively.

11. A chip-type component including a piezo-resonator in accordance with claim 10, the chip-type component further comprising:

first and second spacer plates coupled between said first and second holding parts, said first and second spacer plates being structured and arranged so as not to inhibit said piezo-resonance unit, said first and second vibration transfer parts, said first and second dynamic dampers and said first and second coupling bars of said piezoelectric resonator from vibration and to enclose said elements on side portions thereof, and a pair of case substrates being structured and arranged for retaining said piezo-resonator and said first and second spacer plates so as not to inhibit vibrating portions of said piezo-resonator from vibration.

12. A piezo-resonator comprising:

a piezo-resonance unit that generates vibration;

a vibration transfer part having an end coupled to said piezo-resonance unit, said vibration transfer part receiving and propagating said vibration from said piezo-resonance unit, and having a node of vibration, said node vibrating by said vibration propagated from said piezo-resonance unit; and a dynamic damper coupled to a portion of said vibration transfer part other than said node of vibration, said dynamic damper being structured and arranged to receive said propagated vibration of said piezo-resonance unit to vibrate in a bending mode at a natural frequency substantially identical to that of said piezo-resonance unit such that said propagated vibration is cancelled in accordance with a dynamic vibration absorbing phenomenon thereby preventing inhibition of said vibration of said piezo-resonance unit.

13. A piezo-resonator in accordance with claim 12, further comprising:

a coupling bar having an end coupled to said dynamic damper, and a holding part coupled to another end of said coupling bar.

14. A piezo-resonator in accordance with claim 12, wherein said piezo-resonance unit has a piezoelectric plate and first and second excitation electrodes provided on said piezoelectric plate, and said vibration transfer part including first and second vibration transfer parts coupled to both sides of said piezo-resonance unit respectively, said dynamic damper including first and second dynamic dampers coupled to said first and second vibration transfer parts respectively and structured and arranged to receive said propagated vibration of said piezo-resonance unit to vibrate.

15. A piezo-resonator in accordance with claim 14, further comprising:

first and second coupling bars having first ends coupled to said first and second dynamic dampers respectively, first and second holding parts coupled to second ends of said first and second coupling bars respectively, first and second terminal electrodes provided on said first and second holding parts respectively, and first and second connecting conductive parts connecting said first and second terminal electrodes with said first and second excitation electrodes respectively.

16. A chip-type component including a piezo-resonator in accordance with claim 15, the chip-type component further comprising:

first and second spacer plates coupled between said first and second holding parts, said first and second spacer plates being structured and arranged so as not to inhibit said piezo-resonance unit, said first and second vibration transfer parts, said first and second dynamic dampers and said first and second coupling bars of said piezoelectric resonator from vibration and to enclose said elements on side portions thereof, and a pair of case substrates being structured and arranged to hold said piezo-resonator and said first and second spacer plates so as not to inhibit vibrating portions of said piezo-resonator from vibration.

* * * * *